United States Patent
Hanabata et al.

(10) Patent No.: US 6,921,623 B2
(45) Date of Patent: Jul. 26, 2005

(54) ACTIVE COMPONENTS AND PHOTOSENSITIVE RESIN COMPOSITION CONTAINING THE SAME

(75) Inventors: Makoto Hanabata, Kyoto (JP); Masahiro Sato, Kyoto (JP); Junko Katayama, Kyoto (JP); Satsuki Kitajima, Kyoto (JP)

(73) Assignee: KRI, Inc., Kyoto (JP)

( * ) Notice: Subject to any disclaimer, the term of this patent is extended or adjusted under 35 U.S.C. 154(b) by 13 days.

(21) Appl. No.: 10/203,032

(22) PCT Filed: Dec. 4, 2001

(86) PCT No.: PCT/JP01/10571

§ 371 (c)(1),
(2), (4) Date: Aug. 5, 2002

(87) PCT Pub. No.: WO02/46841

PCT Pub. Date: Jun. 13, 2002

(65) Prior Publication Data

US 2003/0064320 A1 Apr. 3, 2003

(30) Foreign Application Priority Data

Dec. 5, 2000 (JP) .................................. 2000-370205
Jan. 18, 2001 (JP) .................................. 2001-010797

(51) Int. Cl.$^7$ ............................................... G03F 7/004
(52) U.S. Cl. ................... 430/270.1; 430/325; 430/330
(58) Field of Search ............................ 430/270.1, 325, 430/330

(56) References Cited

U.S. PATENT DOCUMENTS 5,233,006 A * 8/1993 Wolter et al. .................. 528/32

(Continued)

FOREIGN PATENT DOCUMENTS

JP 05158235 6/1993

(Continued)

OTHER PUBLICATIONS

Encapsulated Inorganic Resist Technology, Theodore H. Fedynyshyn et al, pp. 627–637.

*Primary Examiner*—Amanda Walke
(74) *Attorney, Agent, or Firm*—Pillsbury Winthrop Shaw Pittman LLP

(57) ABSTRACT

A photosensitive resin composition for using in combination with a photosensitizer comprises an active component selected from an active metal alkoxide represented by the formula (1) or a polycondensate thereof and a particle represented by the formula (2),

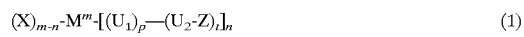

(1)

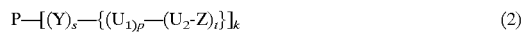

(2)

wherein, X shows a hydrogen, a halogen, an alkoxy group or an alkoxycarbonyl group, M shows a metal atom whose valence m is not less than 2, U1 shows a first connecting unit, U2 shows a second connecting unit and Z shows a group causing a difference in solubility by light exposure, P shows a fine particle carrier, Y shows a coupling residue, n shows an integer of not less than 1 and m>n, p shows 0 or 1, t shows 1 or 2, k shows an integer of not less than 1, and s shows 0 or 1).

The unit $(U1)_p$—$(U2-Z)_t$ is represented by the following formula:

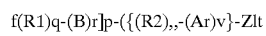

(wherein, R1 and R2 show an alkylene or alkenylene group; and B shows an ester bond, an amide bond, a urea bond, a urethane bond, an imino group, a sulfur atom or a nitrogen atom; Ar represents an arylene or cycloalkylene group; each of the factors, q, r, a and v, shows 0 or 1, and q+r+u+v z l; and Z, p and t have the same meanings defined above).

26 Claims, 6 Drawing Sheets

U.S. PATENT DOCUMENTS 5,399,738 A * 3/1995 Wolter et al. ............... 556/420
5,612,170 A   3/1997 Takemura et al.

FOREIGN PATENT DOCUMENTS

| | | |
|---|---|---|
| JP | 11194491 | 7/1999 |
| JP | 11327125 | 11/1999 |
| JP | 2000-56463 | 2/2000 |
| JP | 2001-194796 | 6/2001 |

* cited by examiner

ACTIVE COMPONENTS AND PHOTOSENSITIVE RESIN COMPOSITION CONTAINING THE SAME

This application is the National Phase of International Application PCT/JP01/10571 filed Dec. 4, 2001 which designated the U.S. and that International Application was not published under PCT Article 21(2) in English.

TECHNICAL FIELD

The present invention relates to an active component which is useful for forming minute patterns such as semiconductor integrated circuits using a beam, for example, ultraviolet rays or far-ultraviolet rays (including excimer lasers or the like); a photosensitive resin composition (resist composition) using the same; and a process for forming a pattern using the same.

BACKGROUND ART

In the field of semiconductor resists, with developing very large scale integrated circuits, higher minute processing techniques have been demanded. Thereupon, light sources of shorter wavelength such as KrF excimer laser (wavelength: 248 nm), ArF excimer laser (wavelength: 193 nm) and F2 excimer laser (wavelength: 157 nm) are utilized instead of g-ray (wavelength: 436 mm) or i-ray (wavelength: 365 mm) of a conventional high-pressure mercury lamp.

However, even when KrF excimer laser or ArF excimer laser is applied to a conventional resist material such as a novolak resin/diazonaphthoquinone-based positive resist, in which g-ray or i-ray is used, sensitivity and resolution of the conventional resist materials are considerably deteriorated owing to light absorption by the novolak resin.

Moreover, with rises in the integration level and performance of semiconductor integrated circuits, there has been demand for resists with better resolution (patterns in submicron order, quartermicron order or smaller) and for improvement of etching resistance in the process of dry development.

For example, as an approach for improving resolution with the use of conventional process for dry development, there has been known a method in which a photosensitive resin is filled with inorganic fine particles, and silicasol and the like are utilized as the inorganic fine particle to impart both resist performance (sensitivity, resolution, etc.) and dry etching resistance. To illustrate, in order to improve dry etching resistance, Japanese Patent Application Laid-Open No. 158235/1993 (JP-5-158235A) discloses a resist composition comprising a resist composed of a cresol novolak resin and naphthoquinonediazido sulfonic ester, in which silicasol added to the resist, and the resist composition is used as an upper layer resist of bilayer. Japanese Patent Application Laid-Open No. 194491/1999 (JP-11-194491A) proposes a photosensitive resin composition, which comprises a photosensitive organic oligomer or polymer, a hydrolyzable and polymerizable organic metal compound or its condensate, and an inorganic filler having a functional group (e.g., silicasol). Japanese Patent Application Laid-Open No. 327125/1999 (JP-11-327125A) discloses a photosensitive resin composition comprising a photosensitive resin, an inorganic fine particle (e.g., silicasol) or an inorganic fine particle having a functional group. Sondi and Matijevic disclose a film composed of a p-hydroxystyrene-t-butyl acrylate copolymer containing $SiO_2$ nanoparticles (silicasol), and report that the $SiO_2$ nanoparticle is highly soluble in a base to act as a solution accelerator and that the resist including such a $SiO_2$ nanoparticle shows almost the same resolution with control (resist) not comprising $SiO_2$ (I. Sondi and E. Matijevic, Resist Technology and Processing XVII, Francis M. Houlihan, Editor, Proceedings of SPIE Vol. 3999(2000), pp. 627–637). Moreover, this literature discloses that a resist system using a transparent $SiO_2$ nanoparticle is useful to wavelengths such as 157 nm.

On the other hand, with the improvement of miniaturization, recently, edge roughness of resist patterns has been becoming of a problem in particular. The edge roughness is particularly prominent in the resist used in thin films such as surface layer resists.

In the above-mentioned resist comprising a silicasol added thereto, a film can be thickened because the silicasol is small in a particle size and is transparent to exposure beam. Further, owing to the small size of silicasol particle, thin film is also obtainable and resolution thereof can be improved to a certain degree. However, since the resist is dissolved at the area where the resist is inhibited from dissolution (e.g., non-exposed area in the case of positive resist) due to high hydrophilicity of silicasol itself, difference in dissolution rate between exposed area and non-exposed area cannot be increased (enlarged) in the above-mentioned resist, therefore resolution, and sharpness or edge roughness of pattern profile cannot be greatly improved.

Moreover, a commercially available silicasol is mostly manufactured by sodium silicate method, therefore sodium may be inevitably left in the products.

Japanese Patent Application Laid-Open No. 56463/2000 (JP-2000-56463A) discloses that an alcohol solution of a resist material containing an alkali-soluble resin is added with an organooxysilane, and subjected to a sol-gel reaction in the presence of moisture to give a silica-alkali soluble resin hybrid material. In this method, a silica component can be uniformly dispersed in the resist material on molecular level with the silica components prevented from precipitation, by conducting a sol-gel reaction in the resist. However, great improvement of resist performance such as resolution is hardly achieved by this method because the difference in solubility between exposed area and non-exposed area in a developer cannot be enlarged.

Moreover, as a resist composition, there has been known a light-amplifying (chemical-amplifying) resist composition comprising a base resin which becomes alkali-soluble with leaving (removing) by an action of an acid, in combination with a photoactive acid generator. However, the difference in solubility between exposed area and non-exposed area cannot be increased even in this composition.

Accordingly, it is an object of the present invention to provide an active component (including an active particle), that is useful for forming a pattern with high sensitivity and high resolution; a photosensitive resin composition comprising the active component; and a process for forming a pattern using the photosensitive resin composition.

It is another object of the present invention to provide a photosensitive resin composition which improves edge roughness of the pattern with etching resistance against oxygen plasma kept; and a process for forming a pattern.

It is still another object of the present invention to provide a photosensitive resin composition which is efficient for largely improving resolution with high sensitivity to shorter wavelength beams (rays); and a process for forming a pattern using the same.

It is other object of the present invention to provide an active component (including an active particle) useful for forming a pattern with high sensitivity and high resolution in which contamination of impurities is inhibited (avoided); an active metal alkoxide useful for providing the active component; a photosensitive resin composition comprising the active component; and a process for forming a pattern using the photosensitive resin composition.

It is still other object of the present invention to provide a photosensitive resin composition and a process for forming a pattern using the same, which can cause (make) a difference in solubility between exposed area and non-exposed area in a developer.

DISCLOSURE OF INVENTION

The inventors of the present invention made intensive and extensive studies to achieve the above-mentioned objects and finally found that the combination use of an active component and a photosensitive resin composition is attributed to forming high resolution pattern with high sensitivity because of a difference in solubility in a developer between exposed area and non-exposed area, wherein a functional group is introduced into the active component [e.g., a fine or finely divided particle (an active particle) capable of being hydrophilic by eliminating a hydrophobic leaving group owing to at least light exposure, a specific metal alkoxide (an active metal alkoxide) or the polycondensate thereof (an active particle formed by polycondensation)] to cause (yield) a difference in solubility owing to light exposure, and that the combination use of the metal alkoxide or a polycondensate thereof, and a photosensitive resin composition, is attributed to forming high(er) resolution pattern with higher sensitivity because of reduction of impurity incorporation. The present invention was accomplished based on the above findings.

That is, the active component (constituent) of the present invention is the one for using (the one which is used or usable) in combination with a photosensitizer which constitutes a photosensitive resin composition, wherein the component comprises at least one member selected from the group consisting of an active metal alkoxide represented by the following formula (1):

  (1)

(wherein, X represents a hydrogen atom, a halogen atom, an alkoxy group or an alkoxycarbonyl group, M represents a metal atom whose valence m is not less than 2, $U_1$ represents a first connecting unit, $U_2$ represents a second connecting unit, Z represents a group causing (making) a difference in solubility by (through or owing to) light exposure, n represents an integer of not less than 1 and m>n, p represents 0 or 1, and t represents an integer of not less than 1 (e.g., 1 or 2)), or a polycondensate thereof, and a particle (particulate) represented by the following formula (2):

  (2)

(wherein, P represents a fine (minute) particle carrier, Y represents a coupling residue, k represents an integer of not less than 1, s represents 0 or 1, and $U_1$, $U_2$, Z, p and t have the same meanings defined above). Incidentally, the first connecting unit $U_1$ and the second connecting unit $U_2$ are generically referred to as connecting unit U in some cases. The particle (active particle) represented by the formula (2) may be a reaction product of an active metal alkoxide represented by the formula (1) or a polycondensate thereof, with a fine particle carrier P.

The active component may be in the form (morphology or configuration) of a particle or an oligomer, and the group Z may be (a) a photo-crosslinkable group or a photo-curable group, or (b) a hydrophilic group protected by a protective group which is capable (competent or qualified) of removing (removable) by (owing to) light exposure. The group Z may be usually a hydrophilic group protected by a protective group which is capable of removing (removable) by light exposure in association with a photosensitizer, and the protective group is capable of removing (removable) by an action of an acid and others. The group Z is capable (competent or qualified) of forming (formable or form-able) a hydroxyl group or a carboxyl group by removal (elimination) of a hydrophobic protective group, and such a group Z is represented, for example, by a group -HP-Pro (wherein, HP represents a hydrophilic group and Pro represents a protective group which imparts hydrophobicity to the hydrophilic group HP and forms the hydrophilic group HP by removing (leaving) owing to light exposure).

The protective group may be (i) a protective group for a hydroxyl group, selected from the group consisting of an alkoxyalkyl group, an acyl group, an alkoxycarbonyl group, an oxacycloalkyl group and a crosslinked cyclic alicyclic group; or (ii) a protective group for a carboxyl group, selected from the group consisting of an alkyl group, a carbamoyl group and a crosslinked cyclic alicyclic group. Specifically, the protective group may be (1) a protective group for a hydroxyl group, selected from the group consisting of a $C_{1-6}$alkyl-carbonyl group, a $C_{1-6}$alkoxy-$C_{1-6}$alkyl group, a $C_{1-6}$alkoxy-carbonyl group and an oxacycloalkyl group; or (2) a protective group for a carboxyl group, selected from the group consisting of a $C_{1-6}$alkyl group, a carbamoyl group, a $C_{1-6}$alkyl-carbamoyl group, a $C_{6-10}$aryl-carbamoyl group and a bi- or tricycloalkyl group.

The metal atom M may be aluminium, titanium, zirconium or silicon, is usually silicon.

The connecting units $U_1$ and $U_2$ may comprise various connecting group, for example, may comprise a unit containing at least one member selected from the group consisting of a chain hydrocarbon, a hydrocarbon ring, a chain hydrocarbon having a hetero atom, and a heterocycle. For example, the connecting units $U_1$ and $U_2$ may be respectively represented by the following formulae:

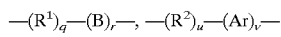

(wherein, each of the factors, $R^1$ and $R^2$, is either same or different, representing an alkylene group or an alkenylene group, B represents an ester bond, a thioester bond, an amide bond, a urea bond, a urethane bond, a thiourethane bond, an imino group, a sulfur atom or a nitrogen atom, Ar represents an arylene or cycloalkylene group which may have a substituent (e.g., a halogen atom and an alkyl group), each of the factors, q, r, u and v, represents 0 or 1, and q+r+u+v≧1).

The compound represented by the formula (1) may be a one in which the group Z means a hydroxyl or carboxyl group protected by a hydrophobic protective group which is capable of removing (removable) by (owing to) light exposure, the metal atom M is selected from group consisting of aluminium, titanium, zirconium and silicon, and the unit $(U_1)_p$—$(U_2$-$Z)_t$ containing a connecting unit is represented by the following formula:

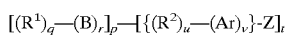

(wherein, $R^1$, $R^2$, B, Ar, p, q, r, t, u and v have the same meanings defined above).

Further, the polycondensate of the active metal alkoxide (1) may be a polycondensate of the active metal alkoxide represented by the formula (1) alone (singly) or a polycondensate (copolycondensate) of the active metal alkoxide represented by the formula (1) and a metal alkoxide represented by the following formula (5):

$$(X)_{m-n-1}M^m(R^5)_{n-1} \quad (5)$$

(wherein, $R^5$ represents a hydrogen atom or an alkyl group, X, M, m and n have the same meanings defined above).

The weight ratio of the active metal alkoxide (1) relative to the metal alkoxide (5) may be, for example, about 10/90 to 90/10. The polycondensate may be in the form of a particle (particulate), for example, a particle having a mean particle size of about 1 to 100 nm.

In the particle (active particle) represented by the formula (2), the mean particle size of the fine particle carrier may be about 1 to 100 nm. The fine particle carrier may be an organic fine particle carrier or an inorganic fine particle carrier (e.g., silicasol). Incidentally, a coupling agent associates with a compound having the metal atom M of the formula (1). Such an active particle (2) may comprise a connecting unit U connecting with an inorganic fine particle P whose mean particle size is 1 to 50 nm through (via) a silane coupling agent Y, a hydrophilic group connecting with the connecting unit, and a protective group which protects the hydrophilic group. Moreover, the group Z which causes (makes) a difference in solubility by (through) light exposure may comprise the hydrophilic group and the protective group. The connecting unit may comprise at least one member selected from the group consisting an aromatic $C_{6-12}$hydrocarbon ring, a monocyclic alicyclic hydrocarbon ring, a crosslinked cyclic alicyclic hydrocarbon ring and an aliphatic hydrocarbon chain, and the hydrophilic group is usually a hydroxyl group or a carboxyl group. The protective group may be (1) a protective group for the hydroxyl group, selected from the group consisting of a $C_{1-4}$alkyl-carbonyl group, a $C_{1-4}$alkoxy-$C_{1-4}$alkyl group, a $C_{1-4}$alkoxy-carbonyl group and a 5- or 6-membered oxacycloalkyl group, or (2) a protective group for the carboxyl group, selected from the group consisting of a $C_{1-4}$alkyl group, a carbamoyl group, a $C_{1-4}$alkyl-carbamoyl group, a $C_{6-10}$aryl-carbamoyl group and a bi- or tricycloalkyl group. The amount of the silane coupling agent may be about 0.1 to 200 parts by weight relative to 100 parts by weight of the fine particle carrier.

The present invention includes a photosensitive resin composition containing the active component, for example includes a photosensitive resin composition which comprises a base resin, a photosensitizer and the active component. The photosensitive resin composition may be a positive one in which an exposed area is water- or alkali-soluble. For example, the photosensitive resin composition may be a one in which a base resin comprises a homo- or copolymer of a monomer which is capable of forming (formable) a hydrophilic group by an action of an acid, and a photosensitizer comprises an photoactive acid generator. In order to form a pattern, such a photosensitive composition may be applied or coated onto a substrate, the coating layer may be exposed to light, the light-exposed layer may be heat-treated, and the heat-treated layer may be developed.

The present invention includes an active metal alkoxide which is represented by the following formula (1):

$$(X)_{m-n}-M^m-\{(U_1)_p-(U_2-Z)_t\}_n \quad (1)$$

(wherein, X represents a hydrogen atom, a halogen atom, an alkoxy group or an alkoxycarbonyl group, M represents a metal atom whose valence m is not less than 2, $U_1$ represents a first connecting unit, $U_2$ represents a second connecting unit, Z represents a group causing a difference in solubility by light exposure, n represents an integer of not less than 1 and m>n, p represents 0 or 1, and t represents 1 or 2).

Furthermore, the present invention includes an oligomer or an active particle, which comprises at least a polycondensate of the active metal alkoxide.

BEST MODE FOR CARRYING OUT OF THE INVENTION

Figure 1:
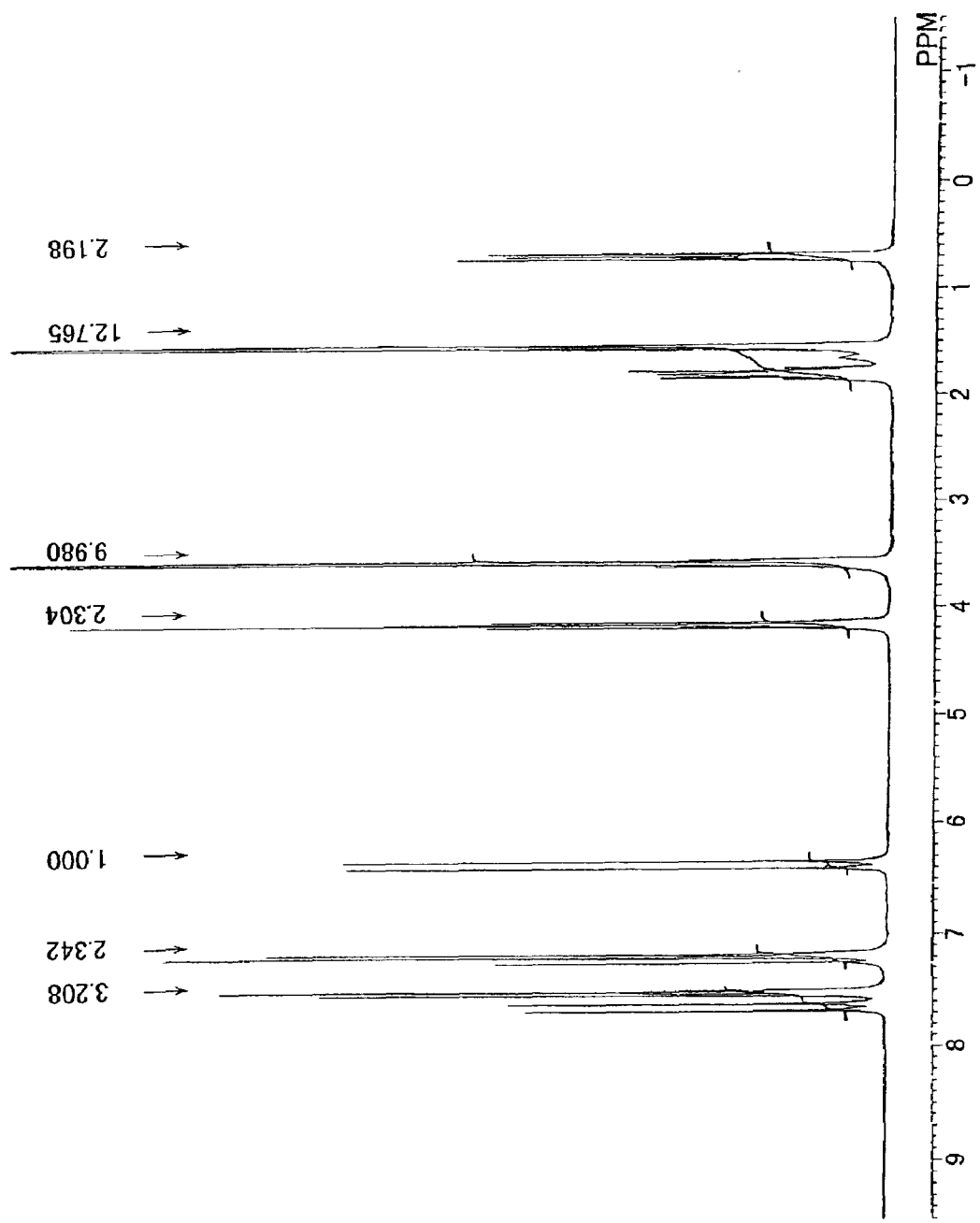
FIG. 1 shows $^1$H-NMR spectrum of a compound obtained in the step (2) (ii) in Example 1.

The active component (or ingredient) of the present invention is used (or usable) in combination with a photosensitizer which constitutes a photosensitive resin composition, and has a unit for causing a difference in solubility owing to at least light exposure. Such an active component comprises at least one member selected from the group consisting of the active metal alkoxide represented by the formula (1) or the polycondensate thereof, and the particle represented by the formula (2).

[Active Metal Alkoxide or a Polycondensate thereof (1)]
(Active Metal Alkoxide (1a))

In the formula (1), the halogen atom represented by X includes fluorine, chlorine, bromine and iodine atoms. As the alkoxy group, there may be exemplified a linear or branched chain $C_{1-10}$alkoxy group such as a methoxy, ethoxy, propoxy, isopropoxy, butoxy, s-butoxy, t-butoxy, pentyloxy, hexyloxy, heptyloxy, octyloxy and decyloxy group (preferably a $C_{1-6}$alkoxy group, more preferably a $C_{1-4}$alkoxy group). As the alkoxycarbonyl group, there may be exemplified a linear or branched chain $C_{1-10}$alkoxycarbonyl group such as a methoxycarbonyl, ethoxycarbonyl, propoxycarbonyl, isopropoxycarbonyl, butoxycarbonyl, s-butoxycarbonyl, t-butoxycarbonyl, hexyloxycarbonyl and octyloxycarbonyl group (preferably a $C_{1-6}$alkoxy-carbonyl group, more preferably a $C_{1-4}$alkoxy-carbonyl group).

The alkoxy group or alkoxycarbonyl group may have a substituent such as a halogen atom, a hydrocarbon group which may have an unsaturated bond (an alkyl group, an alkenyl group, a cycloalkyl group, an aryl group, etc.), a heterocyclic group and an acyl group.

The metal atom whose valence is m, represented by M, is a metal whose valence is not less than 2 (e.g., bivalent to quadrivalent) and which is capable of forming a metal alkoxide, for example, an alkaline earth metal (magnesium, calcium, etc.), a transition metal, a rare earth metal or a metal element of the Groups 3 to 5 and 13 to 15 of the Periodic Table of Elements. In particular, there may be mentioned a metal element of the Group 3 (such as yttrium), a metal element of the Group 4 (such as titanium and zirconium), a metal element of the Group 13 (such as aluminium), a metal element of the Group 14 (such as silicon), and the like. Preferred metal is titanium, zirconium, aluminium and silicon, especially silicon.

As the group Z, a group causing a difference in solubility by light exposure may be mentioned, for example, (a) a photo-crosslinkable group or a photo-curable group, or (b) a hydrophilic group protected by a protective group.

As the (a) photo-crosslinkable or photo-curable group, there may be exemplified azide group, cinnamoyl group, cinnamylidene group, a polymerizable group (a (meth) acryloyl group, allyl group, vinyl group, etc.) and the like. The polymerizable group and the crosslinkable group are especially preferred.

As the hydrophilic group of the (b) hydrophilic group protected by a protective group, there may be mentioned, a water- or alkali-soluble group (a group which imparts solubility by an action of water or an alkali), for example, in addition to an amino group and an N-substituted amino group (e.g., an N,N-di$C_{1-4}$alkylamino group) and the like, a hydroxyl group, a carboxyl group and a sulfur-containing derivative group corresponding to the above-mentioned groups (including a mercapto group, a thiocarboxyl group, a dithiocarboxyl group). The hydroxyl group (including a phenolic hydroxyl group) and the carboxyl group are especially preferable.

In the formula (1), n represents an integer of not less than 1 (e.g., 1 to 3, especially 1 or 2). Incidentally, m is larger than n (m>n), and m minus n leaves 1 to 3 (m-n=1-3), preferably 2 or 3.

A first connecting unit $U_1$ and a second connecting unit $U_2$ are not particularly restricted, and comprise an unit of various organic chains (e.g., a chain hydrocarbon, a hydrocarbon ring, a chain hydrocarbon having a hetero atom and a heterocycle) singly or in combination, and these organic chains may be connected through a connecting (or binding) group. The chain hydrocarbon includes an aliphatic hydrocarbon chain such as alkylene chain (e.g., a linear or branched $C_{1-10}$alkylene chain such as an ethylene chain, a propylene chain, a trimethylene chain and a hexamethylene chain; a linear or branched $C_{2-10}$alkenylene chain such as a vinylene chain, a propenylene chain, a isopropenylene chain and a butenylene chain; and the like). The chain hydrocarbon having a hetero atom includes an alkylene chain (a $C_{2-10}$alkylene chain) containing at least one nitrogen atom in the main chain, a thioether chain (a polythio$C_{2-10}$alkylene ether chain such as a thio$C_{2-10}$alkylene ether chain and a dithio$C_{2-10}$alkylene ether chain), an ether chain (a polyoxy$C_{2-10}$alkylene ether chain such as an oxy$C_{2-10}$alkylene ether chain and a dioxy$C_{2-10}$alkylene ether chain), and the like. The hydrocarbon ring includes an aromatic $C_{6-12}$hydrocarbon ring such as benzene; a cycloalkane ring (a monocyclic alicyclic hydrocarbon ring), for example, a $C_{5-10}$cycloalkane ring such as cyclohexane; a crosslinked cyclic hydrocarbon ring (e.g., a bi- or tricycloalkane ring such as norbornane and adamantane; a $C_{5-10}$cycloalkene ring such as cyclohexene; a bi- or tricycloalkene ring such as norbornene); and the like. Moreover, a hydrocarbon ring may be a ring in which a plurality of hydrocarbon rings may be connected through a hydrocarbon chain if necessary (biphenyl; a ring corresponding to a bis($C_{6-14}$aryl)$C_{1-4}$alkane such as diphenylmethane; etc.). For example, such a group may be exemplified as a group in which a chain hydrocarbon group (a linear or branched $C_{2-4}$alkylene group or a linear or branched $C_{2-4}$alkenylene group, etc.) connects with a hydrocarbon ring group (an arylene group, a cycloalkylene group, a bi- or tricycloalkylene group, etc.). The heterocycle includes a heterocycle containing at least one heteroatom selected from oxygen, nitrogen and sulfur atoms, especially a 5- or 6-membered heterocycle. Further, the chain or cyclic hydrocarbon groups or the heterocycles and so on may have a substituent such as an alkyl group (e.g., a $C_{1-5}$alkyl group) and a halogen atom.

In the formula (1), the coefficient p for the first connecting unit $U_1$ is 0 or 1, and the coefficient t for the second connecting unit $U_2$ is an integer of not less than 1 (especially 1 or 2).

The connecting unit $U_1$ may be a unit represented by the following formula (3a), and the connecting unit $U_2$ may be a unit represented by the following formula (3b).

—(R$^1$)$_q$—(B)$_r$— (3a)

—(R$^2$)$_u$—(Ar)$_v$— (3b)

(in the formula, each of the factors, $R^1$, $R^2$ and Ar, is either same or different, representing a bivalent hydrocarbon group, and B represents a bivalent bond such as an ester bond, a thioester bond, an amide bond, a urea bond, a urethane bond, a thiourethane bond and an imino group; a bivalent atom such as an oxygen atom and a sulfur atom or a trivalent atom such as a nitrogen atom. Each of the factors, q, r, u and v, represents 0 or 1, and the total of q, r, u and v is not less than 1 (q+r+u+v≧1)).

Incidentally, when B is nitrogen atom and r=1, t is 1 or 2, and when B is an atom or a group other than nitrogen atom and r=1, t is usually 1.

As the bivalent hydrocarbon group represented by $R^1$, $R^2$ or Ar, there may be exemplified, a bivalent group corresponding to the above-mentioned chain hydrocarbons (e.g., an alkylene group such as an ethylene group, a propylene group and trimethylene group, an alkenylene group such as a vinylene group and an isopropenylene group) and a bivalent group corresponding to the above-mentioned hydrocarbon rings (e.g., a cycloalkylene group, an arylene group (such as a phenylene group and a naphthalene group), a bi- or tricycloalkylene group, a biphenylene group, a group corresponding to a bisarylalkane) and the like. Preferred $R^1$ and $R^2$ are a chain hydrocarbon group such as a linear or branched chain $C_{2-8}$alkylene group (especially a $C_{2-4}$alkylene group, etc.) and a linear or branched chain $C_{2-8}$alkylene group (especially a $C_{2-4}$alkylene group, etc.) and the like.

Preferred Ar is a hydrocarbon ring group, for example, an arylene group such as a phenylene group and a naphthalene group, a biphenylene group such as a biphenyl group, a bi- or tricycloalkylene group, a group corresponding to a bisarylalkane, and the like, and a $C_{6-12}$arylene group (a $C_{6-10}$arylene group) or $C_{5-8}$cycloalkylene group is especially mentioned. The group Ar may have a substituent such as a halogen atom (e.g., fluorine atom, chlorine atom, bromine atom), an alkyl group (e.g., a $C_{1-4}$alkyl group), an alkoxy group (e.g., a $C_{1-4}$alkoxy group) and an acyl group (e.g., a $C_{1-4}$alkyl-carbonyl group).

In the formula, each of the factors, q, r, u and v, represents 0 or 1, and the total of q, r, u and v is not less than 1 (q+r+u+v≧1), and usually, q plus r is 0 to 2 (q+r=0-2) and u plus v is 1 to 2 (u+v=1-2).

A unit (U$_1$)$_p$—(U$_2$-Z)$_t$ containing the connecting unit is, for example, represented by the following formula (3):

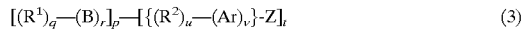

[(R$^1$)$_q$—(B)$_r$]$_p$—[{(R$^2$)$_u$—(Ar)$_v$}-Z]$_t$ (3)

(in the formula, $R^1$, $R^2$, B, Ar, p, q, r, t, u and v have the same meanings defined above).

$R^1$ and $R^2$ may be exemplified the same group as the above-mentioned, and usually, an alkylene group (especially a $C_{2-4}$alkylene group) or an alkenylene group (especially a $C_{2-4}$alkenylene group). B is an ester bond, an amide bond, a urea bond, a urethane bond, an imino group, a sulfur atom or a nitrogen atom, and Ar is usually a hydrocarbon ring group (e.g., a $C_{6-10}$arylene group or a $C_{5-8}$cycloalkylene group), especially a benzene ring or a cyclohexane ring.

Such a metal alkoxide (1) may be obtained by a reacting of a compound having a unit $(X)_{m-n}M^m$ with a compound having the group Z, to form a connecting unit U between the metal M and the group Z, or may be obtained by a reaction of a compound having a unit $(X)_{m-n}$-$M^m$ [especially, $(X)_{m-n}$-$M^m$-$(R^1)_q$] with a compound having a unit $U_2$-Z [especially, $\{(R^2)_u$—$(Ar)_v\}$-Z]. Thus the connecting unit $U_1$ is mostly a connecting or binding group formed by these reaction, and the connecting unit $U_2$ is mostly derived from a compound having a unit $U_2$. Various reactions can be used for the reaction of each component, for example, there may be exemplified the following reactions by a combination of the reactive groups.

(i) an ester bond- (or a thioester bond-) forming reaction of a hydroxyl group (or a mercapto group) or its lower alkyloxy group with a carboxyl group or its reactive derivative group (e.g., an acid anhydride group, an acid halide group, etc.); or a urethane bond- (or a thiourethane bond-)forming reaction of a hydroxyl group (or a mercapto group) with an isocyanate group, (ii) an ester bond- (or a thioester bond-) forming reaction of a carboxyl group or its reactive derivative group with a hydroxyl group (or a mercapto group) or its lower alkyloxy group; an ester bond-forming reaction of a carboxyl group with an epoxy group; an amide bond-forming reaction of a carboxyl group with an amino group; or a ring-opening reaction of a carboxyl group with an oxazoline ring, (iii) an amide bond- (or an imino bond-) forming reaction of an amino group with a carboxyl group or its reactive derivative group (e.g., an acid anhydride group, etc.); a reaction of an amino group with an epoxy group (e.g., an imino bond-forming reaction, etc.); or a urea bond-forming reaction of an amino group with an isocyanate group, (iv) an addition reaction of a hydroxyl group, a mercapto group, an amino group or a hydrogen atom (e.g., silyl group SiH), with a vinyl group, (v) Hech reaction of a halogen atom with a vinyl group (e.g., a coupling reaction of an alkene with a halogen-substituted aromatic compound with the use of a palladium catalyst in the presence of a base).

For example, in the case where the metal M is a silicon atom, as a compound having the unit $(X)_{m-n}M$, there may be exemplified, a tri$C_{1-4}$alkoxysilane such as trimethoxysilane, triethoxysilane and a tripropoxysilane; a $C_{1-4}$alkyldi$C_{1-4}$alkoxysilane such as methyldimethoxysilane and methyldiethoxysilane; a $C_{6-10}$aryldi$C_{1-4}$alkoxysilane such as phenyldimethoxysilane and phenyldiethoxysilane; and other silane compounds having a functional group such as an isocyanate group, an epoxy group, an amino group, a mercapto group, a hydroxyl group, a carboxyl group and an unsaturated bond (e.g., especially, a silane coupling agent).

The silane coupling agent includes a compound represented by the following formula (4):

$(R^6)_u Si(D)_{4-w}$ (4)

(In the formula, $R^6$ represents an organic group having a reactive group, D represents a hydrogen atom, a halogen atom (fluorine atom, chlorine atom, bromine atom and iodine atom) or $OR^7$. $R^7$ represents an alkyl group having 1 to 4 carbon atoms and w is an integer of 0 to 2.).

As the organic group represented by $R^6$, there may be mentioned an alkyl group having a reactive group (e.g., an isocyanatealkyl group, a carboxyalkyl group, an epoxyalkyl group, an aminoalkyl group, a mercaptoalkyl group, a hydroxyalkyl group; an alkyl group having a polymerizable group such as a vinyl group, an allyl group and a (meth) acryloyl group, etc.) or an aryl group having a reactive group (e.g., an isocyanatearyl group, a carboxyaryl group, an aminoaryl group, a hydroxyaryl group; an aryl group having a polymerizable group such as a vinyl group, an allyl group and a (meth)acryloyl group, etc.); and the like. The alkyl group represented by $R^7$, there may be exemplified methyl group, ethyl group, butyl group, t-butyl group.

As an isocyanate group-containing silane coupling agent, there may be mentioned an isocyanatoalkylalkoxysilane (e.g., an isocyanato$C_{1-6}$alkyl$C_{1-4}$alkoxysilane) such as 1-isocyanatomethyl-1,1,1-trimethoxysilane, 1-(1- or 2-isocyanatomethyl)-1,1,1-trimethoxysilane, 1-isocyanatomethyl-1,1,1-triethoxysilane, 1-(1- or 2-isocyanatoethyl)-1,1,1-triethoxysilane, 1-isocyanatomethyl-1-methyl-1,1-dimethoxysilane, 1-chloro-1-isocyanatomethyl-1,1-dimethoxysilane, 1-(3-aminopropyl)-1-isocyanatoethyl-1,1-dimethoxysilane, 1-(3-aminopropyl)-1-isocyanatoethyl-1,1-diethoxysilane, 1-isocyanatomethyl-1-phenyl-1,1-dimethoxysilane, 1-isocyanatopropyl-1-phenyl-1,1-dipropoxysilane, and the like.

As an epoxy group-containing silane coupling agent, there may be mentioned an epoxyalkylalkoxysilane (e.g., an epoxy group-containing a $C_{3-8}$alkyl-$C_{1-4}$alkoxysilane) such as 1-(1,2-epoxypropyl)-1,1,1-trimethoxysilane and 1-glycidyl-1,1,1-trimethoxysilane; a glycidoxyalkylalkoxysilane (e.g., a glycidoxy$C_{1-6}$alkyl$C_{1-4}$alkoxysilane) such as 1-(3-glycidoxypropyl)-1,1,1-trimethoxysilane and 1-(3-glycidoxypropyl)-1-methyl-1,1-dimethoxysilane; and others.

As an amino group-containing silane coupling agent, there may be mentioned an amino group-containing silane coupling agent corresponding to the isocyanate group-containing silane coupling agent, especially, an aminoalkylalkoxysilane (e.g., an amino$C_{1-6}$alkyl-$C_{1-4}$alkoxysilane) such as 1-(3-N-(2'-aminoethyl)aminopropyl)-1-methyl-1,1-dimethoxysilane, 1-(3-N-(2'-aminoethyl)aminopropyl)-1,1,1-trimethoxysilane and 1-(3-aminopropyl)-1,1,1-trimethoxysilane.

As a mercapto group-containing silane coupling agent, there may be mentioned a mercapto group-containing silane coupling agent corresponding to the isocyanate group-containing silane coupling agent, especially, an alkoxysilane having a mercapto group (e.g., a mercapto$C_{1-6}$alkyl-$C_{1-4}$alkoxysilane) such as 1-(3-mercaptopropyl)-1,1,1-trimethoxysilane and 1-(3-mercaptopropyl)-1,1,1-triethoxysilane, and others.

Moreover, a hydroxy group-containing silane coupling agent and a carboxyl group-containing silane coupling agent, corresponding to the isocyanate group-containing silane coupling agent can be also utilized.

As a silane coupling agent having an unsaturated bond, there may be mentioned a silane coupling agent having a polymerizable group such as a vinyl group, an allyl group and a (meth)acryloyl group, etc. The vinyl group-containing silane coupling agent includes 1-vinyl-1,1-dimethyl-1-ethoxysilane, 1-vinyl-1-methyl-1,1-diethoxysilane, 1-vinyl-1,1,1-trimethoxysilane, 1-vinyl-1,1,1-triisopropenoxysilane, 1-vinyl-1,1-dimethyl-1-chlorosilane, 1-vinyl-1-ethyl-1,1-dichlorosilane, 1-vinyl-1,1,1-trichlorosilane, 1-vinyl-1-methyl-1,1-bis(methylethylketoximine)silane, 1-vinyl-1- methyl-1,1-bis(trimethylsiloxy)silane, 1-vinyl-1-methyl-1,1-diacetoxysilane, 1-vinyl-1,1,1-triphenoxysilane, 1-vinyl-1,1,1-tris(t-butylperoxy)silane, and others. Moreover, an allyl group-containing silane coupling agent and a (meth)acryloyl group- (or a (meth)acryloyloxy group-) containing silane coupling agent, corresponding to the vinyl group-containing silane coupling agent can be also utilized. Incidentally, as the silane coupling agent, a commercially available silane coupling agent can be also available.

As a compound having a photo-crosslinkable (or photo-curable) group or a compound having a hydrophilic group, corresponding to the compound having group Z or a unit $U_2$-Z (especially, $R^2$—Ar-Z), there may be exemplified a compound having a reactive group [e.g., a group having an active hydrogen atom such as a hydroxyl group, a carboxyl group and an amino group; an isocyanate group or a vinyl group (including a (meth)acryloyl group)], or a reactive atom (e.g., a halogen atom), in addition to the photo-crosslinkable groups or the hydrophilic groups.

As a compound having a hydroxyl group, there may be exemplified an aliphatic polyhydroxy compound (e.g., a linear or branched $C_{2-10}$alkylene glycol such as ethylene glycol, trimethylene glycol, propylene glycol and tetramethylene glycol; a polyoxy$C_{2-4}$alkylene glycol such as a di- to polyethylene glycol and a di- to polypropylene glycol), an aromatic polyhydroxy compound [e.g., a phenol such as hydroquinone, resorcin, catechol, phloroglucin, oxyhydroquinone, pyrogallol, an alkylester of gallic acid (e.g., a $C_{1-4}$alkylester of gallic acid); a hydroxyaralkyl alcohol (e.g., a hydroxy$C_{6-10}$aryl-$C_{1-4}$alkyl alcohol) such as xylylene glycol and hydroxybenzyl alcohol; a hydroxybenzophenone, a hydroxynaphthalene such as a naphthalene diol and a naphthalene triol; a biphenol, a bisphenol (e.g., a bisphenol A, a bisphenol F, a bisphenol AD, etc.)], an alicyclic polyhydroxy compound [a monocyclic alicyclic diol (e.g., a $C_{5-8}$cycloalkanediol such as cyclohexanediol; a $C_{5-8}$cycloalkenediol such as a cyclohexenediol; a cyclohaxenedimethanol), a crosslinked alicyclic diol (e.g., a bi- or tricycloalkanediol such as a norbornanediol and an adamantanediol)], a heterocyclic polyhydroxy compound [a 5- to 8-membered unsaturated heterocyclic polyhydroxy compound (e.g., a 5- or 6-membered unsaturated heterocyclic di- or trihydroxy compound) such as a dihydroxypyran and a dihydroxyfuran; a 5- to 8-membered saturated heterocyclic polyhydroxy compound (e.g., a 5- or 6-membered saturated heterocyclic di- or trihydroxy compound, especially a dihydroxyoxacycloalkane) such as a dihydroxytetrahydrofuran and a dihydroxytetrahydropyran; etc.] a compound having a hydroxyl group and a halogen atom (bromine atom, iodine atom, etc.) [e.g., a halogenated alcohol (a halogenated $C_{1-10}$alkyl alcohol etc.), a halogenated phenol (e.g., a halo$C_{6-10}$aryl alcohol such as a bromophenol and an iodophenol), a halogenated cycloalkanol (e.g., a halogenated $C_{5-6}$cycloalkanol such as a iodohexanol)], a compound having a hydroxyl group and a carboxyl group [a hydroxycarboxylic acid, for example, a hydroxyaliphatic$C_{2-12}$carboxylic acid (e.g., a hydroxycaproic acid), a hydroxyaromatic$C_{6-10}$carboxylic acid (e.g., salicylic acid, a dihydroxybenzoic acid, gallic acid, a hydroxynaphthoic acid), a hydroxy$C_{5-6}$cycloalkane-carboxylic acid (e.g., a hydroxycyclohexanecarboxylic acid)], a compound having a hydroxyl group and an amino group [e.g., an amino$C_{2-10}$alkyl alcohol such as an ethanolamine and a propanolamine, an aminophenol (an amino$C_{6-10}$aryl alcohol such as an aminophenol, an aminocresol and an aminosalicylic acid, an amino$C_{5-6}$cycloalkanol, etc.] a compound having a hydroxyl group and an epoxy group (e.g., a glycidyl$C_{6-10}$aryl alcohol such as a glycidylphenol), a compound having a hydroxyl group and a vinyl, (meth)acryloyl or allyl group (e.g., a vinyl$C_{6-10}$aryl alcohol such as a vinylphenol, a hydroxy$C_{2-6}$alkyl(meth) acrylate, an ally alcohol), and others.

As a compound having a carboxyl group, there may be mentioned a polycarboxylic acid [e.g., a $C_{1-12}$alkanedicarboxylic acid (e.g., adipic acid, pimelic acid, sebacic acid and azelaic acid), an aromatic dicarboxylic acid (e.g., a benzene dicarboxylic acid, a naphthalene dicarboxylic acid), a $C_{5-6}$cycloalkane-dicarboxylic acid (e.g., a cyclohexanedicarboxylic acid)], a compound having a carboxylic group and an amino group [an amino$C_{2-10}$alkyl-carboxylic acid, an amino$C_{6-10}$aryl-carboxylic acid (e.g., an aminobenzoic acid), an amino$C_{5-6}$cycloalkyl-carboxylic acid (e.g., an aminocyclohexanecarboxylic acid)], a compound having a carboxyl group and a halogen atom (e.g., a halogenated aliphatic$C_{2-10}$carboxylic acid, a halogenated $C_{6-10}$aryl-carboxylic acid such as a chlorobenzoic acid and an iodobenzoic acid, a halogenated $C_{5-6}$cycloalkyl-carboxylic acid such as a chlorocyclohexanecarboxylic acid and an iodocyclohexanecarboxylic acid), a compound having a carboxyl group and an epoxy group (a glycidyl group-containing $C_{6-10}$aryl-carboxylic acid such as a glycidylbenzoic acid), a compound having a carboxyl group and a vinyl, (meth)acryloyl or allyl group [e.g., a (meth)acrylic acid; a vinyl group-containing $C_{6-10}$aryl-carboxylic acid such as a vinylbenzoic acid; an unsaturated polycarboxylic acid such as itaconic acid, maleic acid and fumaric acid or a monoalkylester thereof; etc.], and the like.

As a compound having an amino group, there may be mentioned a diamine, for example, an aliphatic diamine [e.g., a $C_{2-10}$alkanediamine such as ethylenediamine, propylenediamine, 1,4-diaminobutane, hexamethylenediamine, 2,5-dimethylhexamethylenediamine), an aromatic diamine (e.g., a $C_{6-10}$arylenediamine such as a methaphenylenediamine and diaminodiphenylmethane; a xylylenediamine (a $C_{1-4}$alkyl-$C_{6-10}$arylene-$C_{1-4}$alkyl)diamine, etc.)], an alicyclic diamine (e.g. menthenediamine, isophorone diamine and a diamino$C_{5-6}$cycloalkane such as a diaminodicyclohexylmethane), and the like.

As a compound having a halogen atom, there may be mentioned a dihalo$C_{2-10}$alkane (such as a diiodohexane), a $C_{6-10}$aromatic dihalide (such as a diiodobenzene), a dihalo$C_{5-6}$cycloalkane (such as a diiodocyclohexane), and the like. As a compound having a vinyl group, there may be mentioned a $C_{6-10}$aromatic divinyl compound such as a divinylbenzene, and the like. As a compound having an isocyanate group, there may be mentioned an aliphatic diisocyanate such as hexamethylenediisocyanate; an aromatic diisocyanate such as a tolylenediisocyanate and xylylenediisocyanate; an alicyclic diisocyanate such as isophoronediisocyanate; and the like.

In the case of using these compounds, it is easy to control the affinity with a base resin and the solubility to a developer. Incidentally, in these compounds, a hydrophilic group HP (e.g., a hydroxyl group, a carboxyl group) may be protected by a protective group Pro in advance, before reacting it with a compound having a unit $(X)_{m-n}M^m$, or may be protected by a protective group Pro after reacting it with a compound having a unit $(X)_{m-n}M^m$. That is, the group Z causing the difference in solubility may be a group -HP-Pro [in the formula, HP means a hydrophilic group and Pro means a protective group removing ((eliminating or leaving)) by light exposure and forming the hydrophilic group (in particular, a protective group imparting a hydrophobicity to the hydrophilic group. Incidentally, the protective group can be introduced by a conventional method, for example, various methods such as an acetalized reaction, an esterification method, an active esterification method, a mixed acid anhydride method, an azide method, a method using a coupling agent (e.g., dicyclohexylcalboziimide (DCC) method, DCC-additive method, etc.), and the like.

As a protective group Pro of the hydrophilic group HP, there may be mentioned a protective group for a hydroxyl group, for example, an acetal-series protective group such as an alkoxyalkyl group [e.g., a $C_{1-6}$alkoxy-$C_{1-6}$alkyl group (such as 1-methoxyetyl group, 1-ethoxypropyl group and 1-methoxy-isopropyl group), preferably a $C_{1-4}$alkoxy-$C_{1-4}$ alkyl group); an acyl group such as an alkylcarbonyl group (e.g., a $C_{1-6}$alkyl-carbonyl group such as acetyl, propyonyl, isopropyonyl, butyly, t-butylcarbonyl group and isovaleryl group, preferably a $C_{1-4}$alkyl-carbonyl group), a cycloalkylcarbonyl group (e.g., a $C_{5-8}$cycloalkyl-carbonyl group such as cyclohexylcarbonyl group, preferably a $C_{5-6}$cycloalkyl-carbonyl group), an arylcarbonyl group (e.g., a $C_{6-10}$arylcarbonyl group such as benzoyl group); a $C_{1-6}$alkoxy-carbonyl group (e.g., a $C_{1-4}$alkoxy-carbonyl group) such as methoxycarbonyl group, ethoxycarbonyl group and t-butoxycarbonyl (t-BOC) group; an aralkyloxy carbonyl group such as benzyloxycarbonyl group (e.g., a $C_{6-10}$aryl-$C_{1-4}$alkyloxy-carbonyl group); a $C_{5-8}$cycloalkyl group such as cyclohexyl group (e.g., a $C_{5-6}$cycloalkyl group); an aryl group such as 2,4-dinitrophenyl group (e.g., a nitro group-substituted phenyl group); an aralkyl group such as a benzyl group, a 2,6-dichlorobenzyl group, a 2-nitrobenzyl group and a triphenylmethyl group (e.g., a $C_{6-10}$aryl-$C_{1-4}$alkyl group which may have a substituent); an acetal group (a di$C_{1-6}$alkoxy group such as a dimethoxy, diethoxy and 1-methoxy-l-butoxy group); an oxacycloalkyl group such as a tetrahydrofuranyl group and a tetrahydropiranyl group (e.g., a 5- to 8-membered oxacycloalkyl group); a crosslinked cyclic alicyclic hydrocarbon group such as a norbornyl group, an admantyl group and a hydrogenated naphthyl group (e.g., a bi- to tetracycloalkyl group), and the like.

Further, as a protective group for a carboxyl group, there may be mentioned, for example, a $C_{1-6}$alkyl group (e.g., a $C_{1-4}$alkyl group) such as methyl group, ethyl group and t-butyl group; a carbamoyl group which may have a substituent (e.g., an alkyl group, an aryl group, etc.)(carbamoyl group; a $C_{1-6}$alkyl-carbamoyl group such as methylcarbamoyl group and ethylcarbamoyl group (preferably a $C_{1-4}$alkyl-carbamoyl group); a $C_{6-10}$arylcarbamoyl group such as phenylcarbamoyl group); a crosslinked cyclic alicyclic hydrocarbon group such as a norbornyl group, an admantyl group and a hydrogenated naphthyl group (e.g., a bi- to tetracycloalkyl group); a di$C_{1-4}$alkylphosphinothioyl group such as a dimethylphosphinothioyl group; a di$C_{6-10}$arylphosphinothioyl group such as a diphenylphosphinothioyl group; and the like.

In particular, the protective group Pro is preferable to be a hydrophobic protective group which imparts hydrophobicity to the hydrophilic group HP. As the protective group for a hydroxyl group, the following groups are preferred, for example, an acyl group (especially, a $C_{1-4}$alkyl-carbonyl group such as t-butylcarbonyl group), an alkoxycarbonyl group (a $C_{1-4}$alkoxycarbonyl group such as t-BOC group), a 5- or 6-membered oxacycloalkyl group (such as a tetrahydropiranyl group), a bi- or tricycloalkyl group (such as a norbornyl group and an admantyl group), a $C_{1-4}$alkoxy-$C_{1-4}$alkyl group. As the protective group for a carboxyl group, the following groups are preferred, for example, an alkyl group (a $C_{1-4}$alkyl group such as a t-butyl group), a carbamoyl group which may have a substituent; a crosslinked cyclic alicyclic hydrocarbon group such as a norbornyl group, an admantyl group and a hydrogenated naphthyl group (e.g., a bi- to tetracycloalkyl group).

In each of the above-mentioned reactions, a conventional catalyst or solvent can be utilized if necessary. As the catalyst, depending on the species of the reactions, there may be used, for example, an acid (e.g., an inorganic acid such as hydrochloric acid and sulfuric acid; an organic acid such as p-toluenesulfonic acid), a base (e.g., an organic amine such as tertiary amine, etc.), a conventional catalyst for acetalization (e.g., hydrogen chloride, manganese dioxide, sulfuric acid, etc.), and a catalyst for addition reaction (e.g., a transition metal catalyst such as a palladium catalyst). As the solvent, there may be used, for example, water, an organic solvent such as an alcohol, a glycol, a cellosolve, a ketone, an ester, an ether, an amide, a hydrocarbon, a halogenated hydrocarbon, a carbitol and an ester of glycol ether (e.g., a cellosolve acetate and propylene glycol monomethyl ether acetate). Incidentally, in the case of using a component having an isocyanate group, for example, the reaction is preferably conducted in a condition where activity of the isocyanate group can be maintained (e.g., in the absence of moisture, or in the presence of moisture at a amount which does not substantially interfere the activity of the isocyanate group, especially, in nonaqueous system).

In the formula (1), the following combinations may be mentioned as a preferable combination of groups:
X: a $C_{1-4}$alkoxy group, a halogen atom (especially, a $C_{1-2}$alkoxy group),
Z: a hydroxyl or carboxyl group protected by a hydrophobic protective group which is capable of removing (removable) owing to light exposure,
M: a metal atom selected from the group consisting of aluminum, titanium, zirconium and silicon,
$(U_1)_p$—$(U_2$-$Z)_t$: a unit represented by the above-mentioned formula (3),
n=1 or 2,
p=0 or 1 (q+r=0 to 2), and
t=1 or 2 (u+v=1 to 2)

(Polycondensate or Active Particle of an Active Metal Alkoxide (1b))

An active component (especially an active particle) of the present invention may comprise a polycondensate of the above-mentioned active metal alkoxide. Such an active component may be an active particle in the form of a particulate (particulate matter), or a liquid or solid oligomer. The active component, the polycondensate of the active component can be obtained by polycondensing the active metal alkoxide by a conventional sol-gel method to form of a polymer or a sol.

More concretely, the process for producing the active component comprises dissolving a metal alkoxide component comprising at least an active metal alkoxide to an organic solvent, adding water thereto and stirring the mixture in the presence of a polymerizable catalyst. As the organic solvent, such a hydrophilic or water-soluble solvent can be used, for example, an alcohol (e.g., methanol, ethanol and isopropanol), a ketone (e.g., acetone), an ester [e.g., ethyl acetate; an ester of lactic acid such as ethyl lactate; a (poly)oxyalkylene glycol alkyl ether acetate such as propylene glycol methyl ether acetate (PGMEA etc.); etc.], a cellosolve (e.g., a methylcellosolve, a ethylcellosolve and a butylcellosolve), and the like. These solvents may be same with a solvent of a resist solution (e.g., ethyl lactate and PGMEA).

The proportion of water is, relative to 1 mol of the metal atom in the metal alkoxide component, about 0.1 to 10 mmol, preferably about 0.2 to 5 mmol and more preferably about 0.5 to 2 mmol.

As the polymerizable catalyst, there may be used, for example, an acid (e.g., an inorganic acid such as hydrochloric acid, sulfuric acid, nitric acid and a phosphoric acid; an organic acid such as a acetic acid; etc.), or a base (e.g., an inorganic base such as an ammonia, an organic base such as an amine, etc.), and the like. The proportion of the catalyst is, relative to 1 mol of metal atom in the metal alkoxide component, about 0.001 to 0.1 mmol, preferably about 0.005 to 0.05 mmol.

The polymerization temperature may be about 0 to 40° C. (e.g., 10 to 35° C.), preferably a room temperature (about 15 to 30° C.). The polymerization pressure is not especially limited, may be normal pressure (or atmospheric pressure), increased pressure (pressurization), or reduced pressure (depressurization), usually normal pressure. The polymerization time is not especially limited, may be selected within the wide range from 5 minutes to 1 day, and is preferably from 10 minutes to 12 hours, preferably from 30 minutes to 10 hours.

The metal alkoxide component may comprise a metal alkoxide represented by the following formula (5) in addition to the active metal alkoxide. That is, the active metal alkoxide may be copolycondensed with the metal alkoxide (5).

$$(X)_{m-n-1}M^m(R^5)_{n-1} \quad (5)$$

(In the formula, $R^5$ represents a hydrogen atom or an alkyl group. X, M, m and n have the same meanings defined above.)

In the formula (5), an alkyl group represented by $R^5$ may be exemplified by the alkyl groups similar to those mentioned above, especially a methyl group or an ethyl group is preferable. X is usually a halogen atom or an alkoxy group.

In the case of copolycondensing with the metal alkoxide (5), the weight ratio of an active metal alkoxide (1) relative to a metal alkoxide (5) can be selected within the range of, for example, about 5/90 to 90/10 (e.g., about 10/90 to 90/10), and is usually about 5/90 to 80/20 (e.g., about 5/95 to 60/40), preferably about 10/90 to 50/50, and more preferably about 20/80 to 40/60.

The mean particle size of the particulate active component (active particle) can be adjusted by a degree of polymerization, depending on the degree of miniaturization of a pattern, for example, can be selected from the range of about 1 to 500 nm (e.g., about 1 to 100 nm), preferably 1 to 50 nm in accordance with BET method. The preferred mean particle size of the active particle is usually about 2 to 30 nm and preferably about 3 to 25 nm (e.g., about 5 to 25 nm). In particular, since making the smaller mean particle size of the active particle ensures thinning a photosensitive layer, resolution can be improved as much as edge roughness can be reduced. Further, when the mean particle size of the active particle is smaller than an exposing wavelength, because the active particle is substantially transparent to the exposing wavelength, light exposure can be conducted to the depth of the photosensitive layer even if the layer is thickened, and as a result, sensitivity and resolution can be improved as much as a pattern with high sensitivity and high resolution can be formed in regard to a light source of shorter wavelength.

[Active Particle (2) having a Fine Particle Carrier]

The particle represented by the formula (2) comprises a fine (minute) particle carrier and a unit which directly or indirectly bonds to the carrier and causes a difference in solubility by light exposure (especially, a unit which can become hydrophilic by removing (eliminating or leaving) a protective group by light exposure). In the unit, the protective group can be usually removed (eliminated) in association with a photosensitizer by light exposure.

In the above-mentioned formula (2), the connecting unit represented by $U_1$ and $U_2$, and the group represented by Z may be exemplified by the connecting unit and the group Z or coefficients mentioned in the section of the formula (1), the coefficient p and t have the same meanings defined above.

The active particle may be a particle in which s and p are s=p=0 in the formula (2) (e.g., a particle wherein a hydrophilic group of a fine particle carrier such as an organic fine particle is protected by a protective group), or a particle in which at least one factor selected from s and p is 1. Moreover, in the formula (2), k is a value which depends on a concentration of a reactive group (e.g., a hydrophilic group) of carrier and an introduction amount of the group Z by the coupling agent. Incidentally, the coupling agent usually corresponds to a compound having a metal atom M in the formula (1).

More concretely, there may be mentioned the case in which the group Z is a hydrophilic group HP protected by a protective group Pro. For example, in a carrier P having a reactive group, (a) in the case where the reactive group is a hydrophilic group, the hydrophilic group may be protected by a protective group (s=p=0), and (b) in the case where the reactive group is not a hydrophilic group, the hydrophilic group HP may be protected by a protective group Pro by introducing the hydrophilic group HP through a connecting unit $U_1$ and/or a connecting unit $U_2$ (s=0, p=1 and/or t=1). Moreover, in the case where the carrier P is a fine particle such as an inorganic fine particle, the reactive group may be introduced with the use of a coupling agent, and (c) in the case where the reactive group is a hydrophilic group HP, this hydrophilic group HP may be protected by the protective group Pro (s=1, t=0), (d) in the case where the introduced reactive group is not a hydrophilic group, the hydrophilic group HP may be protected by a protective group Pro by introducing a hydrophilic group HP through a connecting unit $U_1$ (s=1, p=1, t=1). Incidentally, in the present specification, a unit—$U_2$-HP—is sometimes referred to as a hydrophilizable unit.

As the reaction of each component, i.e., the fine particle carrier P, the coupling agent Y, the connecting units $U_1$ and $U_2$, various reactions may be utilized, and there may be mentioned, for example, a reaction by the above-mentioned combinations of the reactive groups, concretely, a method which can be utilized for a reaction of a compound having the unit $(X)_{m-n}M^m$ or $(X)_{m-n}$-$M^m$-$(R^1)_q$ with a compound having the group Z or a compound having the unit $U_2$-Z or $\{(R^2)_u—(Ar)_v\}$-Z, for example, (i) the ester bond-(thioester bond-) forming reaction, or the urethane bond- (or a thiourethane bond-) forming reaction, (ii) the ester bond- (or a thioester bond-) forming reaction, the amide bond-forming reaction or the ring-opening reaction, (iii) the amide bond- (or an imino bond-) forming reaction, the reaction of an amino group with an epoxy group (e.g., an imino bond-forming reaction, etc.) or the urea bond-forming reaction, (iv) the addition reaction, and (v) the coupling reaction such as Hech reaction.

Hereinafter, the case introducing a hydrophilic group into an inorganic fine particle through both a coupling agent and a connecting unit is taken as an example and explained. For example, each component may be bonded by reacting a connecting unit U having two hydroxyl groups (e.g., a dihydroxy compound such as resorcin) with a coupling agent Y having an isocyanate group (e.g., a silane coupling agent) to form a compound having a free hydroxyl group and a coupling group (an alkoxy group or a halogen atom), wherein the coupling agent is bonded to one of hydroxyl groups of the unit; protecting the free hydroxyl group by a protective group such as t-BOC group; and then reacting an inorganic fine particle carrier (e.g., silicasol, etc.) with the coupling group (the alkoxy group or the halogen atom). Further, for example, other processes may be employed, that is, protecting a hydroxyl group of a compound having a halogen atom (iodine atom, bromine atom, etc.) and a hydroxyl group (e.g., a halogen-containing aromatic hydroxy compound such as 4-iodophenol) by a protective group such as t-BOC group in advance; subjecting the resultant compound to a coupling reaction with a vinyl group-containing silane coupling agent (e.g., methacryloxypropyltrimethoxysilane) by Hech reaction to bind the compound with an inorganic fine particle carrier via the alkoxy group or halogen atom site in the silane coupling agent. Incidentally, the order of each reaction among each component is not particularly limited, for example, a carrier may be reacted with a coupling agent in advance and then the resultant may be reacted with other components. Moreover, in the case of using a component having an isocyanate group, for example, the reaction is preferably conducted under the condition where the activity of the isocyanate group can be maintained (e.g., in the absence of moisture, or in the presence of moisture at a amount which does not substantially interfere the activity of the isocyanate group, especially, in nonaqueous system).

In each reaction step, a conventional catalyst or a solvent may be used if necessary. As the solvent, there may be used, for example, water, an organic solvent such as an alcohol, a glycol, a cellosolve, a ketone, an ester, an ether, an amide, a hydrocarbon, a halogenated hydrocarbon, a carbitol and an ester of glycol ether (e.g., a cellosolve acetate and a propylene glycol monomethyl ether acetate).

Hereinafter, as a typical active component shown in the formula (2), a active particle, in which the group Z is a hydrophilic group HP protected by the protective group Pro, is taken as an example and explained.

As the hydrophilic group HP, there may be exemplified a water- or alkali-soluble group such as hydroxyl group, carboxyl group and a sulfur-containing derivative group thereof (e.g., mercapto group, a thiocarboxyl group and dithiocarboxyl group), in addition to amino group and an N-substituted amino group (e.g., a N,N-diC$_{1-4}$alkylamino group) and the like, and especially, the hydroxyl group (e.g., a phenolic hydroxyl group) and the carboxyl group are preferred.

As the fine particle carrier P, an organic fine particle [a thermoplastic resin which may be crosslinked (e.g., a styrenic resin which may be crosslinked such as a crosslinked polystyrene, a styrene-(meth)acrylic acid copolymer and a styrene-malefic anhydride copolymer; an (meth)acrylic resin which may be crosslinked such as a crosslinked polymethyl methacrylate and a methyl methacrylate-(meth)acrylic acid copolymer; a silicone resin; a thermosetting resin which may be crosslinked or cured such as a polyamide resin, a crosslinked melamine resin and a crosslinked guanamine resin, etc.] can be also employed. The fine particle carrier P may have a hydrophilic group such as a hydroxyl group and a carboxyl group, and the concentration of these hydrophilic groups may be adjusted according to the amount to be used of a monomer having the hydrophilic group. It is advantageous to use an inorganic fine particle for improving the properties such as heat resistance and dry etching resistance.

As the inorganic fine particle carrier, for example, there may be utilized, a metal alone (simple or single metal) (e.g., gold, silver, copper, platinum, aluminium), an inorganic oxide (e.g., silica (e.g., silica sol such as colloidal silica, aerogels, glass), alumina, titania, zirconia, zinc oxide, copper oxide, lead oxide, yttrium oxide, tin oxide, indium oxide, magnesium oxide), an inorganic carbonate (e.g., calcium carbonate and magnesium carbonate), an inorganic sulfate (e.g., barium sulfate and calcium sulfate), a phosphate (e.g., calcium phosphate and magnesium phosphate), and the like. The inorganic fine particle carriers include sols and gels prepared by, for example, a sol-gel method. These inorganic fine particle carriers can be used either singly or in combination.

Use of the fine particle carriers enhances development efficiency by a developer because developers may be permeated (infiltrated) between fine particles.

The shape of the fine particle carriers is not limited to sphere and may be spheroid, disk, rod-like, or fibrous. The mean particle size of the fine particle carriers, depending on the degree of minuteness of a pattern to be formed, for example, can be selected within the range of about 1 to 1,000 nm, preferably 5 to 500 nm (e.g., 1 to 100 nm) and more preferably 1 to 50 nm (e.g., 5 to 50 nm) in accordance with the BET process. In particular, since making the smaller mean particle size of the active particle ensures thinning a photosensitive layer, resolution can be improved as much as edge roughness can be reduced. Further, when a fine particle carrier (e.g., silicasol) having smaller mean particle size of the active particle than an exposing wavelength is used, because the active particle is substantially transparent to the exposing wavelength, light exposure can be conducted to the depth of the photosensitive layer even if the layer is thickened, and as a result, sensitivity and resolution can be improved as much as a pattern with high sensitivity and high resolution can be formed in regard to a light source of shorter wavelength. Incidentally, such a silicasol is commercially available as an organosol (an organosilicasol). For example, the organosol is available from Nissan Chemical Industries, Ltd. as the tradename "Snowtex collidalsilica".

As a coupling agent corresponding to a residue Y of the coupling agent, for example, there may be exemplified an organic metal compound containing, as the metal M, an alkaline earth metal, a transition metal, a rare earth metal, or a metal element of the Groups 3 to 5 and 13 to 15 of the Periodic Table of Elements, especially a metal element of the Groups 4, 13 and 14 of the Periodic Table of Elements, for example, aluminium, titanium, zirconium, silicon. Among the organic metal compounds, a titanium coupling agent and a silane coupling agent (especially the silane coupling agent) are preferred.

The silane coupling agent includes the coupling agents represented by the formula (4). The reactive group D corresponding to the fine particle carrier of the coupling agent (4) is usually a halogen atom (bromine atom, chlorine atom, etc.), a hydrolytic condensable group such as an alkoxy group (e.g., a C$_{1-4}$alkoxy group such as methoxy group and ethoxy group, especially a C$_{1-2}$alkoxy group) represented by OR$^7$ (R$^7$ represents a C$_{1-4}$alkyl group).

The silane coupling agent includes the above-mentioned coupling agents [e.g., the isocyanate group-containing silane coupling agents, the epoxy group-containing silane coupling agents, the amino group-containing silane coupling agents, the mercapto group-containing silane coupling agents, the hydroxyl group-containing and carboxyl group-containing silane coupling agents corresponding to the isocyanate group-containing silane coupling agents, the vinyl group-containing coupling agents, the allyl group-containing silane coupling agents and the (meth)acryloyl group-containing silane coupling agents].

As the organic metal compound containing, as the metal M, aluminium, titanium or zirconium, there may be exemplified the organic metal compounds corresponding to the above-mentioned silane coupling agents.

The ratio of the coupling agent relative to the inorganic fine particle carrier can be selected from the range of, for example, about 0.1 to 200 parts by weight, preferably about 0.5 to 150 parts by weight, more preferably about 1 to 100 parts by weight relative to 100 parts by weight of the inorganic fine particle carrier.

The connecting unit U includes the above-mentioned units [e.g., a unit containing a chain hydrocarbon (e.g., a linear or branched $C_{1-10}$alkylene chain such as a $C_{2-6}$alkenylene chain), a hydrocarbon ring (an aromatic $C_{6-12}$hydrocarbon ring such as a benzene ring (e.g., an aromatic $C_{6-10}$hydrocarbon ring), a $C_{5-10}$cycloalkane ring, a $C_{5-10}$cycloalkene ring, a crosslinked cyclic hydrocarbon ring (e.g., a bi- or tricycloalkane ring), a ring wherein a plurality of hydrocarbon chains and/or hydrocarbon rings are bonded (e.g., a $C_{6-14}$aryl-$C_{1-4}$alkyl-$C_{6-14}$aryl, etc.), a heterocycle (e.g., a heterocycle containing at least one hetero atom selected from an oxygen atom, a nitrogen atom and a sulfur atom)].

The connecting unit U may have a substituent as far as the characteristic of the active component is not inhibited. Incidentally, in the case where the unit has a substituent (e.g., an alkyl group, a cycloalkyl group and an aryl group), affinity to or compatibility with a base resin can be improved and uniform dispersion of the active component in the photosensitive resin composition can be attained, and also, the difference in solubility between exposed-area and non-exposed area relatively seems to be enlarged.

The compound corresponding to the hydrophilizable unit ($—U_2$-HP-) includes a compound having an active hydrogen atom such as a hydroxyl group, a carboxyl group and an amino group, for example, the above-exemplified compounds [e.g., a compound having plural hydroxyl groups, a compound having plural carboxyl groups, a compound having a hydroxyl group and a carboxyl group, a compound having a hydroxyl group and an amino group, a compound having a carboxyl group and an amino group]. The compound may have a reactive halogen atom like the above-exemplified compounds having a halogen atom. Moreover, the compound may be the above-exemplified compound having an isocyanate group.

With using such a compound, affinity to a base resin or solubility to a developer is easy to control. Incidentally, in these compounds, as mentioned above, the hydrophilic group HP (e.g., a hydroxyl group and a carboxyl group) may be protected by the protective group Pro in advance, or may be protected by the protective group Pro after introduction of the hydrophilic group HP. As the protective group Pro for the hydrophilic group HP, there may be mentioned the above-exemplified protective groups.

In particular, a hydrophobic protective group which imparts hydrophobicity to the hydrophilic group is preferable. For example, as a protective for a hydroxyl group, the following groups are preferable, an acyl group (especially an alkylcarbonyl group such as a t-butylcarbonyl group), an alkoxycarbonyl group (a $C_{1-6}$alkoxycarbonyl group such as t-BOC group), an acetal group (e.g., a di$C_{1-6}$alkoxy group), a 5- or 6-membered oxacycloalkyl group (e.g., a tetrahydropiranyl group), a bi- or tricycloalkyl group (e.g., a norbornyl group and an adamantyl group), a $C_{1-4}$alkoxy-$C_{1-4}$alkyl group and the like. As a protective group for the carboxyl group, an alkyl group (a $C_{1-4}$alkyl group such as t-butyl group), a carbamoyl group which may have a substituent and a bi- or tricycloalkyl group (e.g., a norbornyl group and an adamantyl group) are preferred.

Thus, also in the particle represented by the formula (2), the group Z to cause (generate) the difference in solubility is usually a group -HP-Pro [in the formula, HP represents a hydrophilic group, Pro represents a protective group forming the hydrophilic group HP by removing (eliminating or leaving) owing to light exposure (especially, a protective group which imparts hydrophobicity to the hydrophilic group HP)].

In the particle represented by the formula (2), as a combination of preferable groups, the following combinations may be exemplified.

P: an inorganic fine particle,
Y: a silane coupling residue,
$(U_1)_p$—$(U_2$-Z$)_t$: a unit represented by the above-mentioned formula (3),
Z: a group -HP-Pro (in the formula, HP represents a hydrophilic group (especially a hydroxyl group or a carboxyl group), Pro represents a protective group which imparts hydrophobicity to the hydrophilic group HP and causes (generates) the hydrophilic group HP by removing (eliminating or leaving) owing to light exposure,
s: 1,
p; 0 or 1, and
t: an integer of not less than 1 (especially 1 or 2).

The especially preferable particle comprises a connecting unit bonding to an inorganic fine particle having a mean particle size of 1 to 50 nm through a silane coupling agent; a hydrophilic group bonding to the connecting unit; and a protective group protecting the hydrophilic group, and the group Z which causes the difference in solubility by light exposure comprises the hydrophilic group(s) and the protective group(s). Moreover, the connecting unit usually comprises at least one member selected from the group consisting of an aromatic $C_{6-12}$hydrocarbon ring, a monocyclic alicyclic hydrocarbon ring, a crosslinked alicyclic hydrocarbon ring and an aliphatic hydrocarbon chain, and the hydrophilic group is a hydroxyl group or a carboxyl group. Further, the protective group is usually (i) a protective group for the hydroxyl group selected from a $C_{1-4}$alkyl-carbonyl group, a $C_{1-4}$alkoxy-$C_{1-4}$alkyl group, a $C_{1-4}$alkoxy-carbonyl group, a 5- or 6-membered oxacycloalkyl group and a bi- or tricycloalkyl group, or (ii) a protective group for the carboxyl group selected from a $C_{1-4}$alkyl group, a carbamoyl group, a $C_{1-4}$alkyl-carbamoyl group, a $C_{6-10}$aryl-carbamoyl group and a bi- or tricycloalkyl group.

Incidentally, the particle represented by the formula (2) may be a particle wherein the active metal alkoxide binds to the above-exemplified fine particle carrier. That is, the particle may be a particulate active component obtained by a coupling reaction of the fine particle carrier with the active metal alkoxide represented by the formula (1) with the use of the group X (e.g., an alkoxy group, a halogen atom, etc.) in the active metal alkoxide represented by the formula (1).

[Active Component]

The active component (or the photoactive component) of the present invention is advantageously used (usable) in combination with a photosensitive resin composition. The active component, i.e., the active metal alkoxide or its polycondensate (an oligomer or an active particle) represented by the formula (1) and an active particle represented by the formula (2), can be utilized either singly or in combination.

When the active component (1) is used (usable) in combination with a photosensitizer of a photosensitive resin composition, because of the group Z of the active metal alkoxide, which is introduced into the active component, a difference in solubility can be caused (made or generated) by light exposure. For example, (a) in the case where the group Z is a photosensitive group such as a crosslinkable group, when the active component is applied to a negative resist in combination with a photosensitizer such as a photoactive acid generator and a crosslinking agent, a photopolymerization initiator, crosslinking or polymerization occurs in an exposed area to inhibit dissolution in the exposed area, and as a result, the difference in solubility between exposed area and non-exposed area occurs.

Further, in the active component (1), (2), the protective group is capable of removing (removable) by light exposure, especially in association with a photosensitizer constituting a photosensitive resin composition by light exposure. (b) In the case where the group Z is a hydrophilic group protected by a protective group capable of removing (removable) owing to light exposure, the protective group is eliminated (or deprotected) by light exposure (especially, in association with a photosensitizer owing to light exposure) to cause (make) a hydrophilic group such as a hydroxyl group or a carboxyl group, by using the active component in combination with a photosensitizer such as a photoactive acid generator. Consequently, when the active component is applied to, especially, a positive resist, a hydrophilic group such as a hydroxyl group and a carboxyl group is caused (generated) and dissolution by a developer is accelerated in an exposed area, and dissolution can be restrained by enhancing an affinity to a base resin by an action of the protective group (especially a hydrophobic protective group) in a non-exposed area, resulting in enlarging the difference in dissolution rate between the exposed area and the non-exposed area. In particular, use of a hydrophobic group as the protective group, can realize drastic restraint of solubility in the non-exposed area as well as restraint of swelling of resist with development, resulting in improvement of resolution, even when the particle P in the formula (2) is an inorganic fine particle carrier with high hydrophilicity such as a silicasol. The removal (elimination) of the protective group mostly occurred in relation to (in association with) the photosensitizer, especially by catalytic action of an acid. As such an acid, an acid generated by light exposure (especially an acid generated from a photoactive acid generator constituting a photosensitive resin composition) is advantageously utilized.

[Photosensitive Resin Composition]

Although the photosensitive resin composition (or a resist composition) of the present invention may comprise a photosensitizer and the above-mentioned active component, usually it comprises a base resin (an oligomer or a polymer), a photosensitizer and the above-mentioned active component. The photosensitive resin composition can be developed by an organic solvent (e.g., an alcohol), but usually the photosensitive resin is preferred to be capable of water- or alkali-development. A positive photosensitive resin composition which can be developed by water or an alkali aqueous solution is especially preferable.

As the base resin, there may be exemplified a polymer having a polar group, for example, a hydroxyl group-containing polymer [e.g., a polyvinyl acetal, a polyvinyl alcohol, an ethylene-vinylalcohol copolymer, a hydroxyl group-containing cellulose derivative (e.g., a hydroxyethyl cellulose), a polyvinyl phenolic resin and a novolak resin (e.g., a phenol novolak resin)], a carboxyl group-containing polymer [e.g., a homo- or copolymer comprising a polymerizable unsaturated carboxylic acid (e.g., a (meth)acrylic acid, maleic anhydride and itaconic acid) and a carboxyl group-containing cellulose derivative (e.g., a carboxyl methylcellulose or its salt)], an ester group-containing polymer [e.g., a homo- or copolymer of a monomer such as a vinylester of carboxylic acid (e.g., a vinyl acetate) and an ester of (meth)acrylic acid (e.g., a methyl methacrylate) (e.g., a polyvinyl acetate, an ethylene-vinyl acetate copolymer and a (meth)acrylic resin) and a polyester, a cellulose ester, etc.], a ether group-containing polymer [e.g., a polyalkylene oxide, a polyoxyalkylene glycol, a polyvinyl ether-series resin, a silicon-containing resin, a cellulose ether, etc.], a carbonate group-containing polymer, an amide or N-substituted amide group-containing polymer [e.g., a polyvinyl pyrrolidone, a polyurethane-series polymer, a polyurea, a nylon or a polyamide-series polymer [e.g., a polyamide using a lactam component, a dicarboxylic acid component or a diamine component (e.g., nylon 66, nylon 6, a modified nylon, a star-burst dendrimer (D. A. Tomalia. et al., Polymer Journal, 17,117 (1985)), etc.); a poly(meth) acrylamide-series polymer; a polyamino acid; a polymer having a biuret bond; a polymer having an allophanate bond; and a protein such as gelatin], a polymer having a nitrile group (e.g., an acrylonitrile-series polymer), a polymer having a glycidyl group (an epoxy resin, a homo- or copolymer of glycidyl(meth)acrylate, etc.), a halogen-containing polymer (e.g., a polyvinyl chloride, a vinyl chloride-vinyl acetate copolymer, a vinylidene chloride-series polymer and a chlorinated polypropylene), a polymerizable oligomer or polymer (e.g., an oligomer or polymer having a polymerizable group such as a (meth)acryloyl group, an allyl group, a vinyl group and a cinnamoyl group), and the like. The base resin may be utilized either singly or in combination of two or more species.

Incidentally, to enhance the sensitivity against exposure beams of a shorter wavelength, a resin having high transparency to the exposure beam (e.g., a non-aromatic resin such as a alicyclic resin) may be utilized as the base resin. In the case using the non-aromatic photosensitive resin (composition), utilization of exposure sources of shorter wavelength can be achieved as well as formation (or constitution) of minuter patterns.

As the polymerizable oligomer or resin constituting a negative resist, there may be usually exemplified an epoxy (meth)acrylate, a polyester(meth)acrylate, an unsaturated polyester resin, a polyurethane(meth)acrylate, a polymerizable polyvinyl alcohol-series polymer (e.g., a product in a reaction of a polyvinyl alcohol with an N-methylol acrylamide), and the like. The non-polymerizable resin constituting a negative resist includes a polyvinylphenol-series resin (e.g., a homopolymer of a vinylphenol, a copolymer of a vinylphenol with other copolymerizable monomer (s)), a polyamide-series polymer, a silicone resin-based polymer (a silicone resinous polymer), and the like. As the copolymerizable monomer, there may be exemplified, for example, an acrylic monomer (a (meth)acrylic acid, a $C_{1-4}$alkyl(meth)acrylate such as methyl methacrylate, a hydroxy$C_{2-4}$alkyl(meth)acrylate such as hydroxyethyl methacrylate, a glycidyl(meth)acrylate), a styrenic monomer such as styrene, and the like.

In the negative resist, if necessary, a polymerizable monomer or oligomer having a photopolymerizable group (e.g., a (meth)acryloyl group, an acrylamide group and a vinyl group) [e.g., a monofunctional photopolymerizable compound such as a (meth)acrylic acid or a derivative thereof (e.g., a (meth)acrylate and a (meth)acrylamide), vinyl acetate, styrene and N-vinyl pyrrolidone; a polyfunctional (multifunctional) photopolymerizable compound such as a (meth)acrylate of polyol (e.g., an ethylene glycol di(meth) acrylate, etc.); and the like] may be used together.

As a photosensitizer in the negative resist, a conventional photosensitizer or photo-sensitizer may be employed, for example, an azide compound (e.g., an aromatic azide compound, especially an aromatic diazide compound), a photoactive acid generator (e.g., an ester of sulfonic acid, a salt of a Lewis acid, etc.) and a crosslinking agent (e.g., a melamine derivative such as a methylol melamine and a alkoxymethylmelamine, etc.), a pyrylium salt, a thiapyrylium salt, a photodimerization sensitizer, a photopolymerization initiator [a ketone (acetophenone, propiophenone, an anthraquinone, a thioxanthone, benzophenone or a derivative thereof), a benzoin ether or a derivative thereof, an acylphosphineoxide, etc.], a dissolution inhibitor, and the like.

The preferred negative resists include a combination of a resin having a phenolic hydroxyl group (e.g., a novolak resin and a polyvinyl phenolic resin), a photoactive acid generator, and a crosslinking agent, and the like.

The typical base resin constituting a positive resist includes a novolak resin (e.g., a phenol novolak resin), a resin in which a hydrophilic group (e.g., a hydroxyl group and/or a carboxyl group) is protected by a protective group capable of removing (removable) [e.g., a polyvinyl phenolic resin in which a phenolic hydroxyl group is protected by a protective group capable of removing (removable) (e.g., a homopolymer of a vinylphenol, or a copolymer of a vinylphenol and the above-exemplified copolymerizable monomer, etc.), a hydroxyl and/or carboxyl group-containing (meth)acrylic resin (e.g., a homo- or copolymer of (meth)acrylate, or a copolymer of (meth)acrylate and the above-exemplified copolymerizable monomer), a hydroxyl and/or carboxyl group-containing cyclic olefinic resin, etc.] and the like.

The preferred base resin is a homo- or copolymer of a monomer forming a hydrophilic group (an alkali-soluble group or a group which imparts alkali-solubility) by catalytic action of an acid (especially an acid generated from an acid generator), for example, a homo- or copolymer of a vinyl-series monomer such as a polyvinyl phenolic resin; a homo- or copolymer of a vinyl-series or (meth)acrylic monomer having a monocyclic alicyclic hydrocarbon group, a homo- or copolymer of a vinyl-series or (meth)acrylic monomer having a crosslinked cyclic hydrocarbon group (such as a norbornyl group and an adamantyl group); a homo- or copolymer of a cyclic olefin [e.g., a homopolymer of a $C_{5-8}$cyclic monoolefin such as cyclopentene, a crosslinked or terpene-series $C_{7-12}$cyclic monoolefin such as norbornene and bornene, a cyclic diene such as cyclopentadiene and dicyclopentadiene or a copolymer with a copolymerizable monomer (e.g., the above-mentioned monomers, besides maleic anhydride, etc.)]; and the like. In these polymers, the hydrophilic groups such as hydroxyl groups and carboxyl groups are usually protected by a protective group partially or wholly. The proportion of the protective group relative to the hydrophilic group of the base resin may be about 10 to 100 mol %, preferably about 20 to 100 mol %, and more preferably about 30 to 100 mol %.

Incidentally, the above-mentioned resin forming a hydrophilic group by deprotection may be obtained by polymerizing a monomer in which a hydrophilic group is protected by a protective group (e.g., the protective group exemplified in the section of the active alkoxide) in advance, or may be obtained by polymerizing a monomer having a hydrophilic group and protecting the hydrophilic group of the obtained resin by the protective group.

Among the monomers having a hydrophilic group, as a monomer having a hydroxyl group, such a polymerizable monomer having one or plural hydroxyl group(s) is mentioned, for example, a cyclic olefin (e.g., a monocyclic or a crosslinked cyclic olefin such as a hydroxycyclohexene and a hydroxynorbornene); a vinylphenolic monomer (e.g., a hydroxystyrene and a hydroxyvinyltoluene); a hydroxyalkyl(meth)acrylate (e.g., hydroxy$C_{2-4}$alkyl(meth) acrylate such as hydroxyethyl(meth)acrylate, hydroxypropyl (meth)acrylate and 2-hydroxybutyl(meth)acrylate, etc.); a vinyl monomer having a monocyclic alicyclic group such as a vinylhydroxycyclohexane, a (meth)acrylate having a monocyclic alicyclic group [e.g., a hydroxycycloalkyl (meth)acrylate (e.g., a hydroxycyclo$C_{5-8}$alkyl(meth) acrylate, etc.) such as a hydroxyhexyl(meth)acrylate, a hydroxyoxacycloalkyl(meth)acrylate, etc.]; a (meth)acrylate having a crosslinked alicyclic group such as a hydroxynorbornyl (meth)acrylate and a hydroxyadamantyl(meth) acrylate (e.g., a hydroxybi- or tri-$C_{7-20}$cycloalkyl(meth) acrylate); a $C_{5-8}$cyclic monoolefin such as a hydroxycyclopentene, a bridged cyclic or terpene-series $C_{7-12}$alkcyclic olefin such as a hydroxynorbornene and a hydroxybornene, a cyclic diene such as a hydroxycyclopentadiene and a hydroxydicyclopentadiene; and the like. These monomers having a hydroxyl group can be used either singly or in combination.

As a monomer having a carboxyl group, there may be mentioned a polymerizable monomer having one or plural carboxyl group(s) or one or plural acid anhydride group(s), for example, a (meth)acrylic acid, maleic acid, fumaric acid, maleic anhydride, itaconic acid, a vinylbenzoic acid, a (meth)acrylate having a monocyclic alicyclic group such as a carboxycycloalkyl (meth)acrylate (e.g., a carboxycyclo$C_{5-8}$alkyl(meth)acrylate; a (meth)acrylate having a crosslinked alicyclic group (e.g., a carboxybi- or tri-$C_{7-20}$cycloalkyl (meth)acrylate) such as a carboxynorbornyl(meth)acrylate and a carboxyadamantyl (meth)acrylate; a $C_{5-8}$cyclic monoolefin such as a carboxycyclopentene, a bridged cyclic or terpene-series $C_{7-12}$cyclic olefin such as a carboxynorbornene and a carboxybornene, a cyclic diene such as a carboxycyclopentadiene and a carboxydicyclopentadiene and the like. These monomers having a carboxyl group can be used either singly or in combination.

These monomers having a hydrophilic group may be used in a combination of monomers having different kind of hydrophilic groups, for example, a combination of a monomer having a hydroxyl group with a monomer having a carboxyl group. Further, a monomer having a hydrophilic group may be used in combination with a copolymerizable monomer.

As the copolymerizable monomer, there may be exemplified, for example, an alkyl(meth)acrylate; a glycidyl (meth)acrylate; a styrenic monomer such as styrene; a (meth)acrylate having a monocyclic alicyclic group such as a cycloalkyl(meth)acrylate and an oxacycloalkyl(meth) acrylate; a (meth)acrylate having a crosslinked alicyclic group such as a norbornyl(meth)acrylate and an adamantyl (meth)acrylate. The copolymerizable monomer can be used either singly or in combination. In the copolymer with a copolymerizable monomer, the proportion of the monomer having a hydrophilic group is, relative to the total amount of monomers, about 10 to 100% by weight, preferably about 25 to 80% by weight, and more preferably about 30 to 70% by weight.

In the resin forming a hydrophilic group by deprotection, as a protective group for the hydrophilic group, there may be mentioned the protective groups exemplified in the section of the active metal alkoxide, for example, a protective group for a hydroxyl group such as an alkoxyalkyl group, an alkoxycarbonyl group, a cycloalkyl group, an oxacycloalkyl group and a crosslinked alicyclic group; and a protective group for a carboxyl group such as an alkyl group.

The typical resin includes, for example, a resin (e.g., a vinyl phenol, a homo- or copolymer of a hydroxyl group-containing alicyclic(meth)acrylate such as a hydroxycycloalkyl(meth)acrylate, a hydroxynorbornyl (meth)acrylate and a hydroxyadamantyl(meth)acrylate, a homo- or copolymer of a cyclic olefin such as a hydroxynorbornene and a hydroxycyclopentadiene) in which a hydroxyl group is protected by a protective group such as an alkoxyalkyl group, an alkoxycarbonyl group (t-BOC group, etc.) and an acetal group; a (meth)acrylic resin (e.g., a homo- or copolymer of a hydroxyalkyl(meth)acrylate, etc.) in which a hydroxyl group is protected by an alicyclic group such as a cycloalkyl group (including an oxacycloalkyl group and a bi- or tricycloalkyl group such as norbornyl group and adamantyl group); a (meth)acrylic resin (e.g., a homo- or copolymer of an unsaturated carboxylic acid or an acid anhydride thereof such as (meth)acrylic acid and maleic anhydride, a homo- or copolymer of a carboxyl group-containing alicyclic(meth)acrylate such as a carboxynorbornyl(meth)acrylate and a carboxyadamantyl (meth)acrylate, a homo- or copolymer of a cyclic olefin such as a carboxynorbornene and a carboxycyclopentadiene) in which a carboxyl group is protected by a protective group such as an alkyl group (e.g., t-butyl group).

The preferred positive resist includes a combination of a phenol novolak resin and a photosensitizer (e.g., a quinonediazide such as a diazobenzoquinone derivative and a diazonaphthoquinone derivative, etc.), and a combination between a resin forming a hydrophilic group by a deprotection (especially deprotection by catalytic action of an acid generated from an acid generator) and a photosensitizer (photoactive acid generator).

Further, the base resin may have various functional groups, for example, a hydroxyl group, an alkoxy group, a carboxyl group, an acid anhydride group, an alkoxycarbonyl group, an acyl group and an amino group, in addition to the above-mentioned hydrophilic group.

As a photosensitizer in the positive resist, a conventional photosensitizer or photo-sensitizer may be selected from, for example, a diazonium salt (e.g., a diazonium salt, a tetrazonium salt, a polyazonium salt, etc.), a quinonediazide (e.g., a diazobenzoquinone derivative and a diazonaphthoquinone derivative), a photoactive acid generator and a dissolution inhibitor.

As the photoactive acid generator, there may be exemplified the following compounds. Incidentally, trade names produced by Midori Kagaku Co. Ltd. are written within parentheses for reference. As the photoactive acid generator, there may be exemplified a derivative of sulfonium salt [e.g., a sulfonic acid ester (e.g., an arylalkane sulfonate (particularly, a $C_{6-10}$aryl$C_{1-2}$alkane sulfonate) such as 1,2,3-tri(methylsulfonyloxy)benzene); an arylbenzene phosphonate (particularly, a $C_{6-10}$aryltoluene phosphonate which may have a benzoyl group) such as 2,6-dinitrobenzyltoluenesulfonate and a benzoin tosylate; an aralkylbenzene sulfonate (particularly, a $C_{6-10}$aryl-$C_{1-4}$alkyltoluene sulfonate which may have a benzoyl group) such as 2-benzoyl-2-hydroxy-2-phenylethyltoluene sulfoonate; a disulfone such as diphenylsulfone; a Lewis acid salt (e.g., a triarylsulfonium salt (particularly, a triphenylsulfonium salt) such as a triphenylsulfonium hexafluorophosphate (TPS-102), a triphenylsulfonium hexafluoroantimony (TPS-103), 4-(phenylthio)phenyldiphenylsulfonium hexafluoroantimony (DTS-103), 4-methoxyphenyldiphenylsulfonium hexafluoroantimony (MDS-103), a triphenylsulfonium methanesulfonyl, a triphenylsulfonium trifluoromethanesulfonyl (TPS-105) and a triphenylsulfonium nonafluorobutanesulfonyl (TPS-109), etc.], a derivative of phosphonium salt; a derivative of diarylhalonium salt [e.g., a Lewis acid salt such as a diaryliodonium salt (e.g., diphenyliodoniumhexafluorophosphate, 4,4'-di(t-butylphenyl)iodonium hexafluorophosphate (BBI-102), 4,4'-di(t-butylphenyl)iodonium hexafluoroantimonate (BBI-103), 4,4'-di(t-butylphenyl)iodonium tetrafluoroborate (BBI-101), 4,4'-di(t-butylphenyl)iodonium trifluoromethanesulfonate (BBI-105), 4,4'-di(t-butylphenyl) iodonium camphorsulfonate (BBI-1060), diphehyliodonium trifluoromethanesulfonate (DPI-105), 4-methoxyphenyl phenyliodonium trifluoromethanesulfonate (DPI-105), etc.), a derivative of a diazonium salt (a Lewis acid salt such as p-nitrophenyldiazoniumhexafluorophosphate), a diazomethane derivative, a triazine derivative [e.g., a haloalkyltriazinylaryl such as 1-methoxy-4-(3,5-di(trichloromethyl) triazinyl)naphthalene (TAZ-106) and 1-methoxy-4-(3,5-di (trichloromethyl)triazinyl)benzene (TAZ-104), a haloalkyltriazinylalkenylaryl such as 1-methoxy-4-[2-(3,5-ditrichloromethyltriazinyl)ethenyl]benzene (TAZ-110), 1,2-dimethoxy-4-[2-(3,5-ditrichloromethyltriazinyl)ethenyl] benzene (TAZ-113) and 1-methoxy-2-[2-(3,5-ditrichloromethyltriazinyl)ethenyl]benzene (TAZ-118), etc.], an imidylsulfonate derivative [a succinimidyl camphorsulfonate (SI-106), succinimidyl phenylsulfonate (SI-100), succinimidyl toluylsulfonate (SI-101), succinimidyl trifluoromethylsulfonate (SI-105), phthalimidyl trifluorosulfonate (PI-105), naphthalimidyl camphorsulfonate (NAI-106), naphthalimidyl methanesulfonate (NAI-100), naphthalimidyl tuluylsulfonate (NAI-101), norborneneimidyl trifluoromethanesulfonate (NDI-105), etc.], and the like. Moreover, sulfone derivatives are also included, for example, a compound having a unit —$SO_2$—C(=N)— such as trade name "DAM-101", "DAM-102", "DAM-105" and "DAM-201"; a compound having a unit —$CH_2SO_2$— such as "DSM-301"; a compound having a unit =N—O—$SO_2$— such as "PAI-101". Particularly, Lewis acid salts (e.g., Lewis acid salts such as phosphonium salts) are preferred.

In the negative and positive resists, the amount to be used of the photosensitizer can be selected, for example, from the range of about 0.1 to 50 parts by weight, preferably about 1 to 30 parts by weight, and more preferably about 1 to 20 parts by weight (especially about 1 to 10 parts by weight), relative to 100 parts by weight of a base resin.

Incidentally, the photosensitive resin (composition) can be selected according to exposing wavelength, too, for example, in the case of using KrF excimer laser (248 nm) as a light source for exposure, there can be used, for example, a chemical-amplifying positive photosensitive resin composition which comprises a vinyl-series resin (e.g., a polyvinyl phenol resin in which a hydroxyl group is protected by a leaving group) or an acrylic polymer (e.g., a (meth)acrylic homo- or copolymer in which a carboxyl group is protected by a leaving group) and a photosensitizer (e.g., an acid generator), and a dissolution inhibitor.

In the case of using ArF excimer laser (193 nm) as the light source for exposure, there can be used, for example, a chemical-amplifying positive photosensitive resin composition which comprises a (meth)acrylic resin (e.g., an aliphatic group-containing (meth)acrylic homo- or copolymer in which a carboxyl group is protected by a protective group (a leaving group) such as t-butyl group and an alicyclic hydrocarbon group (e.g., an adamantyl group, etc.) or a resin (a homo- or copolymer) containing an alicyclic hydrocarbon such as norbornene in the main chain, a photosensitizer (an acid generator), a dissolution inhibitor, and the like.

Moreover, in the case of using $F_2$ excimer laser (157 nm) as a light source for exposure, there can be used, for example, a chemical-amplifying positive photosensitive resin composition which comprises a polymer having a carbon-fluorine bond or a silicon-oxygen bond, or a homo- or copolymer of a phenolic monomer, a photosensitizer (an acid generator), a dissolution inhibitor, and the like.

In the photosensitive resin composition of the present invention, the amount of the active component can be selected from the wide range of about 0.01 to 1000 parts by weight as far as film-formability, sensitivity, resolution of patterns are not damaged, and is usually selected from the range of about 5 to 1000 parts by weight, preferably about 10 to 500 parts by weight and more preferably about 10 to 300 parts by weight, especially about 10 to 100 parts by weight, on a solid matter basis, relative to 100 parts by weight of a base resin.

To the photosensitive resin composition, various additives may be added, for example, a stabilizer (e.g., an antioxidant), a plasticizer, a surfactant, a dissolution accelerator, and a coloring agent (e.g., dyes, pigments), if necessary. Further, for ease of handling, for example, in order to improve handling properties such as coating, the photosensitive resin composition may comprise a solvent (e.g., the solvents exemplified in the section of the active metal alkoxide).

The photosensitive resin composition of the present invention can be prepared in accordance with a conventional method, for example, by mixing a photosensitive resin [a photosensitive resin composition comprising a base resin (a polymer or an oligomer) and a photosensitizer] and an active component. The photosensitive resin composition usually contains a solvent [e.g., the solvents exemplified in the section of the active metal alkoxide (e.g., a hydrophilic or water-soluble solvent), for example, an ester of lactic acid such as ethyl lactate; an alkylene glycol alkylether acetate such as ethylene glycol alkylether acetate and propylene glycol methylether acetate (e.g., PGMEA); a (poly) oxyalkylene glycol alkylether acetate].

[Photosensitive Layer]

The photosensitive layer can be formed by applying (spreading or coating) the above-described photosensitive resin composition to a substrate (a base material). According to the intended pattern and use, the substrate can be suitably selected from metals (aluminum), glass, ceramics (e.g., alumina, copper doped alumina and tungsten silicate), plastics and others, and the substrate may be a semiconductor substrate such as silicon wafer.

The surface of the substrate may be previously treated thereby to improve the adhesion with the photosensitive layer, depending on its intended use. The surface treatment includes a surface treatment using the silane coupling agent described above (e.g., a hydrolytic polymerizable silane coupling agent having a polymerizable group) or others, a coating treatment with an anchor coating agent or a base coat agent (e.g., a polyvinyl acetal, an acrylic resin, a vinyl acetate-series resin, an epoxy resin, a urethane resin), or with a mixture of such base coat agent with an inorganic fine particles (particles finely divided), and others.

Incidentally, after applying the photosensitive resin composition to the substrate, solvents may be evaporated by drying. For example, removal of solvents may be conducted by soft-baking (pre-baking) with the use of a heating means such as a hot plate.

So that the photosensitive resin composition of the present invention can improve plasma resistance (oxygen plasma resistance), heat resistance and dry etching resistance, too, it is preferred that the photosensitive layer is formed at least on the surface of a resist layer. The structure of the photosensitive layer can be selected according to the process of forming patterns or the intended circuit structures, and may be a single- or multi-layered structure (or a lamination layer, a composite structure). For example, a single-layered photosensitive layer is utilized in a single-layer forming process in which a single photosensitive layer is formed on a substrate, and particularly suitable for use in forming a heat-resistant pattern by dry etching. A multi-layered (composite structure) photosensitive layer improves the oxygen plasma resistance largely, and thus it is advantageous in improving the resolution even when the exposing wavelength (of light) for irradiation is at the vicinity of limit of lithography resolution. For example, a double-layered photosensitive layer is utilized in a double-layer forming process comprising: forming an undercoat resist layer (which does not necessarily have photosensitivity) on a substrate, forming a photosensitive layer thereon, exposing the photosensitive layer to light, developing the pattern, and etching the undercoat resist layer to give a pattern by plasma treatment (e.g., oxygen plasma treatment, etc.) or other means. A triple-layered photosensitive layer can be utilized in a multi-layer forming process in which an undercoat layer, an intermediate layer and a photosensitive layer are formed on a substrate in this order, exposed to light and patterned by developing, and then the intermediate and undercoat layers are etched. The undercoat and intermediate layers may be made from compositions composed of any photosensitive resins (e.g., a photosensitive resin composition comprising a base resin and a photosensitizer) and inorganic fine particles, or from photosensitive resins containing no inorganic fine particle (e.g., a photosensitive resin composition comprising a base resin and a photosensitizer).

The thickness of the photosensitive layer is not particularly restricted and, for example, can be selected within the range of about 0.01 to 10 $\mu$m, preferably about 0.05 to 5 $\mu$m, preferably about 0.08 to 2 $\mu$m, and is usually about 0.09 to 1 $\mu$m (e.g., about 0.1 to 0.7 $\mu$m).

The photosensitive layer can be formed by conventional coating methods such as spin coating method, dipping method, and casting method. If necessary, the coated composition is dried to remove the solvent thereby to form a photosensitive layer.

[Process for Forming Pattern]

Patterns (particularly, minute patterns) can be carried out by a conventional lithography technique which is a combination of exposure, development and etching.

For example, a pattern can be formed by applying or coating the photosensitive resin composition onto a substrate to form a photosensitive layer, exposing the coating layer to light, and developing the light-exposed layer. In particular, in the case using a chemical-amplifying photosensitive resin, heating treatment is preferably conducted after exposure (e.g., baking after exposure (post exposure bake, PEB)), to efficiently diffuse an acid generated by exposure. Moreover, after patterning by development, an etching treatment by plasma treatment (e.g., oxygen plasma) may be conducted.

The exposure of the photosensitive layer can be carried out according to a conventional method, for example, by pattern-irradiating the layer with light or pattern-exposing the layer to light, through a given mask. As the light for patternwise exposure, various beams (e.g., a beam of wavelengths of about 50 to 450 nm, especially about 100 to 450 nm) are available, for example, a beam of a halogen lamp, a high pressure mercury lamp, a UV lamp and others; a radial ray (radiation ray) of an excimer laser [e.g., XeCl (308 nm), KrF (248 nm), KrCl (222 nm), ArF (193 nm), ArCl (172 nm) and F2 (157 nm)], an electron beam (g-ray (436 nm), i-ray (365 nm), etc.), X-ray and EB-ray, depending on the photosensitive properties of the photosensitive resin composition, the degree of minuteness of the pattern, kinds of the base resin and so on, and the beams may be the ones of single-wavelength or complex (composite)-wavelength. In particular, the excimer lasers such as KrF (248 nm), ArF (193 nm) and $F_2$ (157 nm) are advantageously utilized. Moreover, with the use of resists comprising a non-aromatic base resin, transparency against shorter wavelength beams can be realized as well as improvement of sensitivity. For example, in the case of using KrF excimer laser (248 nm) as the light source for exposure, such a chemical-amplifying photosensitive resin composition is available, for example, a positive photosensitive resin composition which comprises a resin forming a hydrophilic group by deprotection [e.g., a polyvinyl phenolic resin in which a hydroxyl group is protected by a protective group or a (meth)acrylic resin in which a carboxyl group is protected by a protective group] and a photosensitizer (acid generator); and a negative photosensitive resin composition which comprises the above-mentioned resin forming a hydrophilic group by deprotection, an acid generator and a crosslinking agent; and others.

Incidentally, the energy for exposure can be selected according to the photosensitive properties (e.g., solubility, etc.) of the above photosensitive resin composition, and the exposing time can be usually selected within the range of about 0.005 second to 10 minutes, and preferably about 0.01 second to 1 minute.

After exposure, heat treatment may be conducted, if necessary. In particular, in the case of using a chemical-amplifying photosensitive resin composition, heat treatment (PEB) is advantageously conducted. The temperature of heating (pre-bake and PEB) is about 50 to 150° C., preferably about 60 to 150° C., more preferably about 70 to 150° C., and heating time is about 30 seconds to 5 minutes, preferably about 1 to 2 minutes.

The high resolution pattern can be formed by developing the photosensitive layer in a conventional manner after pattern-exposing. Various developers or developing agents (e.g., water, alkaline aqueous solutions) are usable for development, and the choice thereof depends on the type of the photosensitive resin composition. Preferred developers include water and alkaline developers. If necessary, the developer may contain a small amount of an organic solvent (e.g., a hydrophilic or water-soluble solvent such as alcohols typified by methanol, ethanol, and isopropanol, ketones typified by acetone, ethers typified by dioxanes and tetrahydrofurane, cellosolves, cellosolve acetates), a surfactant and others. There is no particular restriction on the developing method, and the paddle (meniscus) method, dipping method, spraying method and others are adaptable.

Incidentally, besides the pre-bake and PEB, in an appropriate step from application of the photosensitive resin composition to development, the coated film (photosensitive layer) may be subjected to heat- or cure-treatment at a suitable temperature. If necessary, for example, after the development, the coated film may be subjected to heat-treatment.

In the present invention, introduction of a functional group which causes a difference in solubility by light exposure, into an active component can achieve causing the difference in solubility between exposed area and non-exposed area, even if the active component is combined with a photosensitive resin (a photosensitive resin composition comprising a base resin and a photosensitizer) to form a photosensitive layer. In particular, when the group causing the difference in solubility is a hydrophilic group protected by a protective group, since the formed photosensitive layer is protected (especially becomes hydrophobic) and the surface of the layer becomes hydrophobic state, especially in a positive resist, hydrophobic state in a non-exposed area can be maintained, resulting in deprotecting of the protecting group and accelerating dissolution in the exposed area. Thus, difference in dissolution rate between non-exposed area and exposed area larger can be enlarged. Moreover improving edge roughness can be realized, as well as obtaining an edge being a sharp pattern in a plane shape and in a shape at cross section.

Incidentally, various hypotheses are proposed as a cause of the edge roughness, and part of the reason for the cause are said to be the following factors, nonuniformity of resist composition in a pattern-edge part, aggregation between a hydrophobic polymer (in the case of positive chemical-amplifying resist, a polymer before deprotection) and a hydrophilic polymer, nonuniform dispersal of a photoactive acid generator in a resist, and others.

INDUSTRIAL APPLICABILITY

According to the present invention, introduction of a group which causes a difference in solubility by light exposure, into an active component can be enlarged the difference in solubility between exposed area and non-exposed area, even if the active component is combined with a photosensitive resin (a photosensitive resin composition comprising a base resin and a photosensitizer) to form a photosensitive layer, resulting in forming a pattern with high sensitivity and high resolution. In particular, when an active component comprises a specific active metal alkoxide or a polycondensate thereof, contamination of impurity can be efficiently inhibited (avoided). Further, according to the photosensitive resin composition of the present invention, with keeping etching resistance against oxygen plasma, edge roughness of the pattern can be largely improved, furthermore, high sensitivity for a light source of shorter wavelength light source can be achieved, resulting in improving resolution of patterns to a large extent.

Therefore, the present invention can be utilized in a variety of application such as a material for forming circuits (a resist for semiconductor production, a printed wiring board, etc.), a material for forming image (a printing plate material, a materials for relief printing, etc.). In particular, the present invention can be advantageously utilized in the resist for semiconductor production because high sensitivity and high resolution can be achieved.

EXAMPLES

Hereinafter, the present invention will be described in further detail based on examples, and the examples should by no means be construed as defining the scope of the invention.

Examples 1 to 2 and Comparative Example 1

1. Preparation of a Photosensitive Resin Composition (1) Preparation of a Photosensitive Resin To 1 part by weight of polyvinylphenol resin having a weight average molecular weight of 8,500 in which 37 mol % of the hydroxyl group was substituted with t-BOC (tert-butoxycarbonyloxy) group, was added 0.02 part by weight of the photoactive acid generator represented by the following formula (A), and to the resultant mixture, 6 parts by weight of propylene glycol monomethyl ether acetate as a solvent were added and mixed to prepare a positive photoresist.

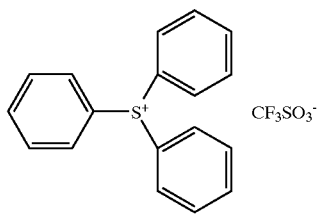

(A)

(2) Active Component (Silicasol)

(i) Synthesis of 1-(t-butoxycarbonyoxy)-4-iodobenzene

Into 1250 mL of acetone, were dissolved 125.0 g (568 mmol) of p-iodophenol and 69 mg (5.7 mmol) of N,N-dimethylaminopyridine, and to thus obtained solution, 124 g (568 mmol) of di-t-butylcarbonate was added dropwise at 40° C. with stirring. After completion of dropping, the reaction solution was kept with stirring for one night to carry out the reaction. After completion of the reaction, the obtained solution was put into 5 L of iced water. The formed precipitation was collected by suction filtration, dried and recrystallized by methanol to provide 113 g of 1-(t-butoxycarbonyoxy)-4-iodobenzene.

(ii) Synthesis of 1-[2-{(3-trimethoxysilyl)propyloxycarbonyl}vinyl]-4-(t-butoxycarbonyloxy)benzene Into a mixture of 1 L of triethylamine and 200 mL of acetonitrile, were dissolved 55.0 g of 1-(t-butoxycarbonyloxy)-4-iodobenzene synthesized in the step (i) and 42.5 g of 3-trimethoxysilylpropyl acrylate, and the reaction system was substituted by argon by bubbling argon into liquid phase. To the reaction system, was added 770.0 mg of palladium acetate as a catalyst, the mixture was refluxed for one night (Hech reaction). After completion of the reaction, removing the solvent, a product was extracted by hexane from obtained residue. Hexane was removed from the extraction to prepare 47.5 g of 3-(trimethyxysilyl)propylp-(t-butoxycarbonyloxy)cinnamate, that is, 1-[2-{(3-trimethoxysilyl)propyloxycarbonyl}vinyl]-4-(t-butoxycarbonyloxy)benzene being the objective compound.

The formula of the reaction steps including the above-mentioned step is shown as follows:

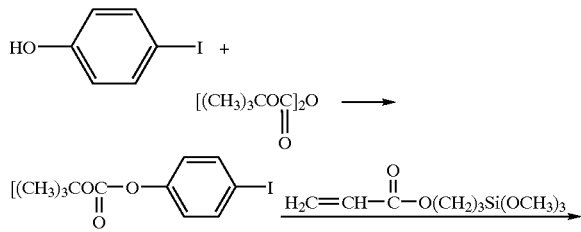

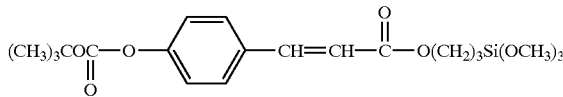

Figure 2:
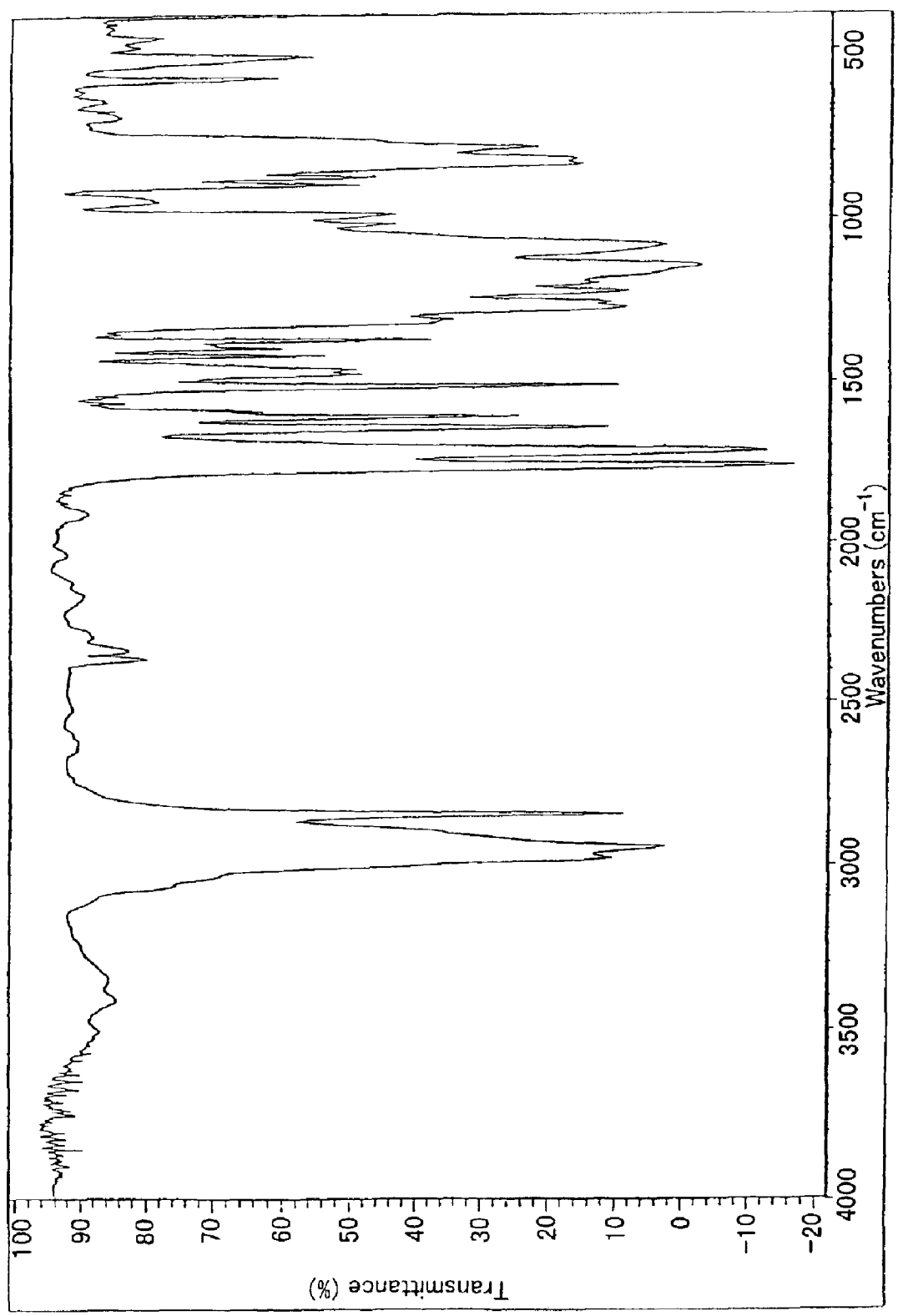
FIG. 2 shows IR spectrum of the compound obtained in the step (2) (ii) in Example 1.

The $^1$H-NMR and IR spectra of the obtained compound are shown in FIG. 1 and FIG. 2, respectively.

$^1$H-NMR(CDCl$_3$) ppm: 0.7(t, 2H, CH$_2$), 1.6(s, 9H, t-Bu), 1.8(q, 2H, CH$_2$), 3.6(s, 9H, OCH$_3$), 4.2(t, 2H, CH$_2$), 6.4(d, 1H, C=CH), 7.2(d, 2H, C$_6$H$_4$), 7.5(d, 2H, C$_6$H$_4$), 7.6(d, 1H, C=CH).

Moreover, in FIG. 2, absorption by C=O stretching vibration in ester groups and carbonate groups was observed in the vicinity of 1700 to 1800 cm$^{-1}$. It is obvious that the objective compound is obtained from these results.

(iii) Synthesis of a Silicasol

Into a 300 mL of reactor, were fed 70 g of propylene glycol monomethylether acetate (PGMEA) and 54 g of 20% by weight aqueous ammonia, and the mixture was stirred at 30° C. for 20 minutes. Into the resultant solution, 22.1 g of 1-[2-{(3-trimethoxysilyl)propyloxycarbonyl}vinyl]-4-(t-butoxycarbonyloxy)benzene synthesized in the step (ii), 2.34 g of tetraethoxysilane and 2.0 g of triethoxymethylsilane were respectively added dropwise for 1 hour, and further stirred at 30° C. for 6 hours. Thereafter, the reaction solution was filtered by a membrane filter having a mean hole size of 0.1 μm, and then ammonia was removed by rinsing the filtrate with purified water, and further water was removed by dehydration under a reduced pressure. After that, the content of propylene glycol monomethylether acetate (PGMEA) was adjusted by addition, or removal under a reduced pressure to prepare a propylene glycol monomethylether acetate (PGMEA) solution of silicasol in which the content of silicasol is 30% by weight.

(3) Preparation of a Photosensitive Resin Composition

The photosensitive resin obtained in the step (1) and the active component (silicasol) obtained in the step (2) were mixed together in the ratio shown in Table 1 (denoted by solid ratio without solvent) to prepare a photosensitive resin composition. Incidentally, the example without the active component (silicasol) was made as Comparative Example 1.

2. Pattern Formation and Evaluation of Properties (Sensitivity, Resolution and Oxygen Plasma Resistance)

(1) Pattern Formation

After treating a washed silicon wafer by hexamethyldisilazane, the photosensitive resin composition was coated on the wafer by means of a spin coater in order that a resist layer of 0.4 μm thick after dried was formed and the wafer was baked on a hot plate at 100° C. for 1 minute. Thereafter, exposure was conducted through a test mask having a line-and-space pattern with different line widths, using a reduced projection exposing machine (manufactured by Canon Inc., FPA-3000EX5, NA=0.63) having an exposing wavelength of 248 nm (KrF excimer laser) with the exposure amount varied in steps. After baking the wafer at 100° C. on a hot plate for 1 minute, the wafer was paddle-developed with 2.38% by weight a tetramethylammonium hydroxide aqueous solution for 1 minute to give a positive pattern.

(2) Evaluation of the Properties

The positive pattern was evaluated for its properties according to the following manner.

(i) Sensitivity: expressed in terms of such an amount of exposed dose to print just as the same size of the mask with a line width of 0.25 μm that the ratio of the width of the line relative to that of the space becomes 1:1 (the smaller the value is, the higher the sensitivity is).

(ii) Resolution: expressed in terms of a minimum width of the lines distinctly formed by exposing at the amount of exposed dose in which the line width of the mask is 0.25 μm, the ratio of the width of the line relative to that of the space becomes 1:1 (the smaller the value is, the higher the resolution is).

(iii) Oxygen plasma resistance: using a plasma etching device (manufactured by Tokyo Shinku, K.K., SUPER COAT N400), the wafers after development were subjected to oxygen plasma etching under the following conditions.

Feeding system: cathode couple
Electrode size: 80 mmØ
Gas: oxygen
Pressure: 8.645 Pa
rf voltage applied: 85W
rf electric power density: 1.69 W/cm²
Treatment time: 5 minutes The film thickness of each wafer after etching was measured. The thickness of the lost portion by etching was divided by etching time to give a value represented by the rate of oxygen plasma ($O_2$-RIE rate, nm/sec). The smaller the value is, the higher the oxygen plasma resistance is. The results are shown in Table 1.

TABLE 1

| | Composition | | | |
|---|---|---|---|---|
| | Photosensitive resin (parts by weight) | Active component (silicasol) (parts by weight) | Sensitivity (mJ/cm²) | Resolution (μm) | $O_2$-RIE rate (nm/sec) |
| Ex. 1 | 1 | 0.11 | 30 | 0.17 | 45 |
| Ex. 2 | 1 | 0.25 | 25 | 0.17 | 20 |
| Comp. Ex. 1 | 1 | 0 | 50 | 0.23 | 70 |

Examples 3 to 4 and Comparative Example 2
1. Preparation of a photosensitive resin composition
(1) Preparation of a photosensitive resin Into methylisobutylketone, were dissolved 2-methyladamantyl methacrylate and γ-butylolactone methacrylate at the nurture ratio (molar ratio) of 1/1, radical polymerization was conducted at 80° C. for 10 hours using azobisisobutylonitrile (AIBN) as an initiator to prepare a resin having a weight average molecular weight of 14,500. n-Hexane was used as a solvent for reprecipitation. Into 1 part by weight of the obtained resin, was added 0.02 part by weight of the photoactive acid generator represented by the following formula (B), and mixed with 7 parts by weight of propylene glycol monomethyl ether acetate as a solvent to prepare a positive photoresist.

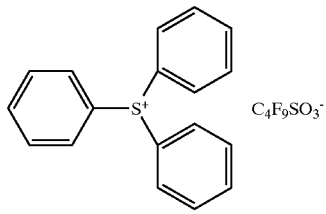

(B)

(2) Active Component (Silicasol)
(i) Synthesis of tert-butyl 3-[3-(trimethoxysilyl)propylthio]propionate Into 300 mL of dehydrated ethyl acetate, were dissolved 58.8 g (0.3 mol) of 3-(trimethoxysilyl)-1-propanethiol and 38.4 g (0.3 mol) of tert-butyl acrylate, and the reaction system was substituted by argon by bubbling argon in thus obtained solution. To the reaction solution, was added 2.94 g of dicumylperoxide (manufactured by NOF Corporation ltd., PERBUTYL PV) as a radical initiator, the mixture was refluxed with heating for 24 hours. After completion of the reaction, solvent was removed to prepare 96.0 g (0.294 mol) of tert-butyl 3-[3-(trimethoxysilyl)propylthio]propionate being the objective compound.

The formula of the reaction steps is shown as follows:

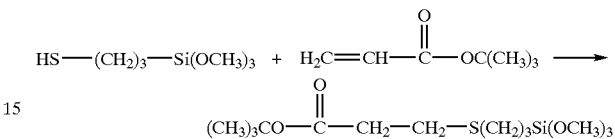

Figure 3:
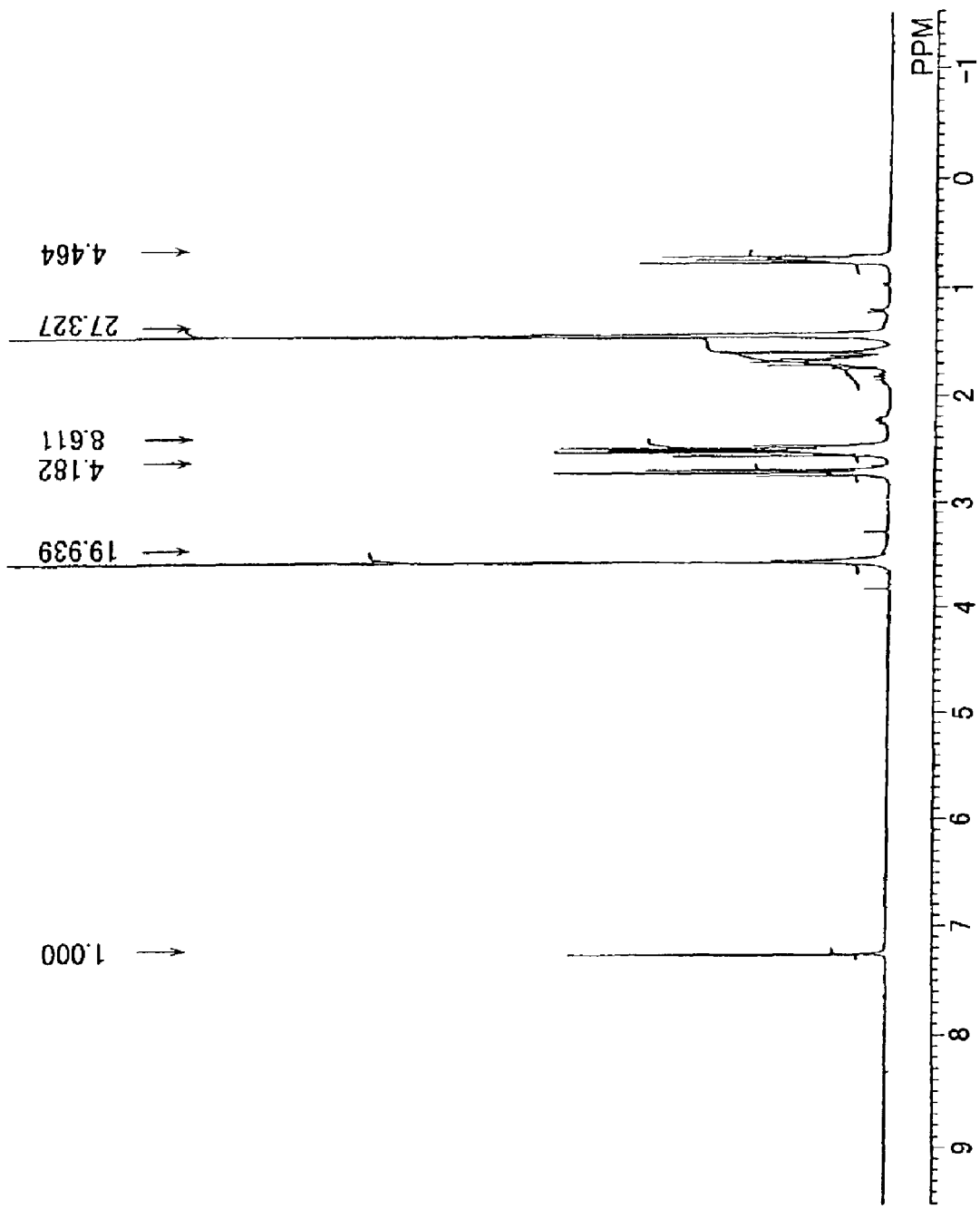
FIG. 3 shows $^1$H-NMR spectrum of a compound obtained in the step (2) (i) in Example 3.
Figure 4:
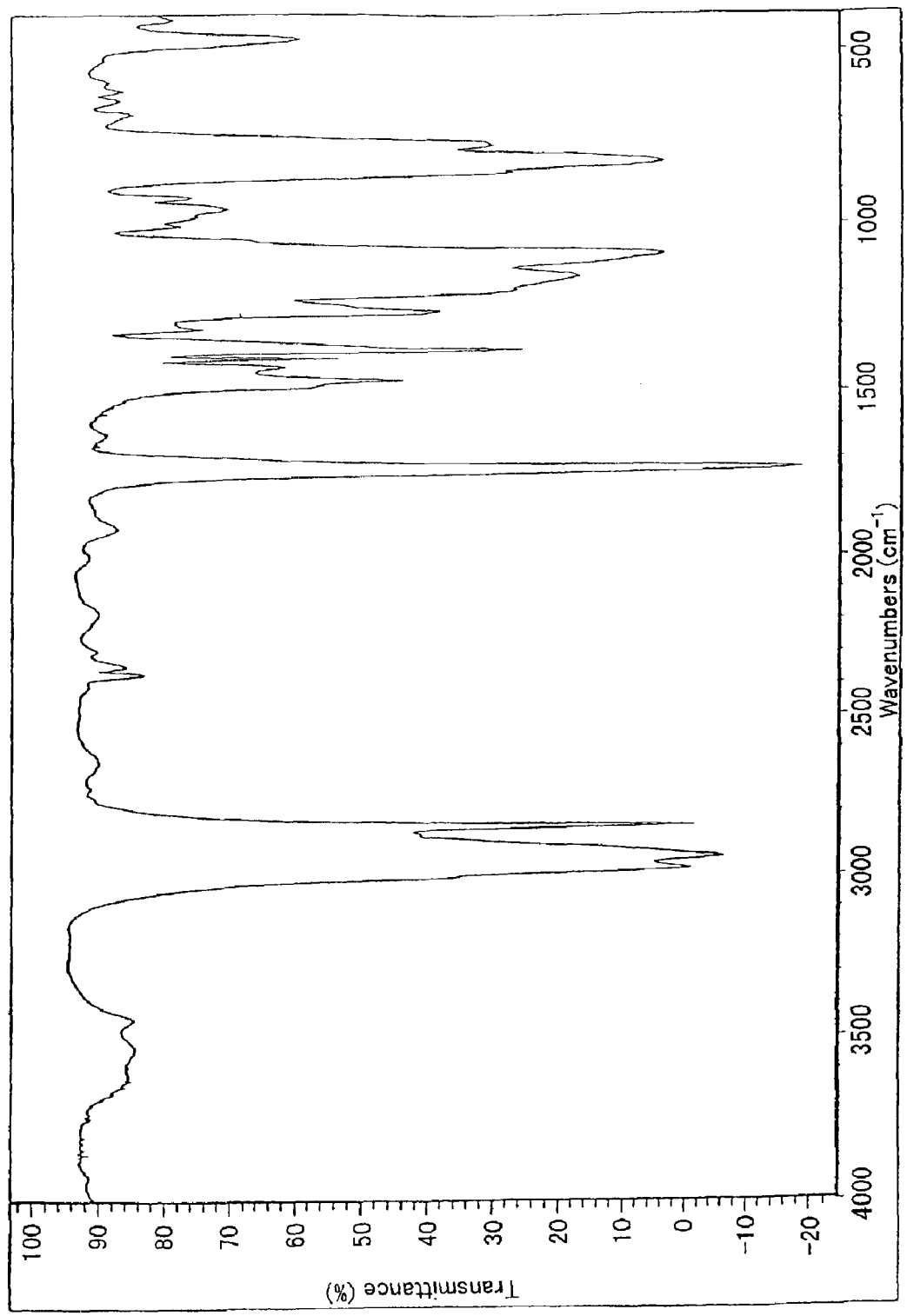
FIG. 4 shows IR spectrum of the compound obtained in the step (2) (i) in Example 3.

The ¹H-NMR and IR spectra of the obtained compound are shown in FIG. 3 and FIG. 4, respectively.

¹H-NMR: 0.7, 1.6–1.8, and 2.4–2.8 ppm: methylene (CH₂) 1.4 ppm: t-butyl(CH₃)₃C 3.6 ppm: methoxy(OCH₃)₃

Moreover, in FIG. 4, specific absorption by carbonyl group was observed in the vicinity of 1730 to 1740 cm⁻¹. It is obvious that objective compound is obtained from these results.

(ii) Synthesis of a Silicasol

Into a 300 ml reactor, were fed 70 g of propylene glycol monomethylether acetate (PGMEA) and 54 g of 20% by weight aqueous ammonia, and the reaction mixture was stirred at 30° C. for 20 minutes. Into the resultant mixture, 42.0 g of tert-butyl 3-[3-(trimethoxysilyl)propylthio] propionate synthesized in the step (i), 3.1 g of tetraethoxysilane and 2.7 g of triethoxymethylsilane were respectively added dropwise for 1 hour, and further stirred at 30° C. for 6 hours. Thereafter, the reaction solution was filtered by a membrane filter having mean hole size of 0.1 μm, and then ammonia was removed by rinsing the filtrate with purified water, and further water was removed by dehydration under a reduced pressure. After that, the content of propylene glycol monomethylether acetate (PGMEA) was adjusted by addition or removal under a reduced pressure to prepare a propylene glycol monomethylether acetate (PGMEA) solution of silicasol in which content of silicasol is 30% by weight.

(3) Preparation of a Photosensitive Resin Composition

The photosensitive resin obtained in the step (1) and the active component (silicasol) obtained in the step (2) were mixed together in the ratio shown in Table 2 (denoted by solid ratio without solvent) to prepare a photosensitive resin composition. Incidentally, the example without the active component (silicasol) was made as Comparative Example.

2. Pattern Formation and Evaluation of Properties (Sensitivity, Resolution and Oxygen Plasma Resistance)
(1) Pattern Formation After treating a washed silicon wafer by hexamethyldisilazane, the photosensitive resin composition was coated on the wafer by means of a spin coater in order that a resist layer of 0.3 μm thick after dried was formed, and the wafer was baked on a hot plate at 130° C. for 1 minute. Thereafter, exposure was carried out through a test mask having a line-and-space pattern with different line widths, using a reduced projection exposing machine (NA=0.63) having an exposing wavelength of 193 nm (ArF excimer laser) with the exposure amount varied in steps. After baking the wafer at 130° C. on a hot plate for 1 minute, the wafer was paddle-developed with 2.38% by weight a tetramethylammonium hydroxide aqueous solution for 1 minute to give a positive pattern.

(2) Evaluation of Properties of Resist

The positive pattern was evaluated for its properties according to the following manner.

(i) Sensitivity: expressed in terms of such an amount of exposed dose to print just as the same size of the mask with a line width of 0.20 μm that the ratio of the width of the line relative to that of the space becomes 1:1 (the smaller the value is, the higher the sensitivity is).

(ii) Resolution: expressed in terms of a minimum width of the lines distinctly formed by exposing at the amount of exposed dose in which the line width of the mask is 0.20 μm, the ratio of the width of the line relative to that of the space becomes 1:1 (the smaller the value is, the higher the resolution is).

(iii) Oxygen plasma resistance: evaluated in the same manner as Example 1.

The results are shown in Table 2.

TABLE 2

| | Composition | | | | |
|---|---|---|---|---|---|
| | Photosensitive resin (parts by weight) | Active component (silicasol) (parts by weight) | Sensitivity (mJ/cm$^2$) | Resolution (μm) | O$_2$-RIE rate (nm/sec) |
| Ex. 3 | 1 | 0.11 | 21 | 0.15 | 55 |
| Ex. 4 | 1 | 0.25 | 15 | 0.14 | 25 |
| Comp. Ex. 2 | 1 | 0 | 30 | 0.19 | 90 |

Examples 5 to 8 and Comparative Example 3

1. Preparation of a Photosensitive Resin Composition (1) Preparation of Photosensitive Resin Into 200 mL of toluene, were dissolved 30 g of tert-butyl methacrylate and 0.2 g of azobisisobutylonitrile. The reactor is substituted by argon, polymerization was conducted, by heating solution at 60° C. for 12 hours with stirring. After completion of the polymerization, the reaction solution was poured into a large amount of methanol to solidify a resin, and the solidified resin was rinsed with methanol several times. This resin was dried at room temperature, under a reduced pressure for one night to prepare a poly tert-butyl methacrylate having a weight average molecular weight of 35000 at a yield of 33%.

Into 1 part by weight of this poly tert-butyl methacrylate, was added 0.02 part by weight of the photoactive acid generator (B) used in Example 3, and mixed with 6 parts by weight of propylene glycol monomethyl ether acetate as a solvent to prepare a positive photoresist.

(2) Active Component (Silicasol)

(i) Synthesis of a Silicasol

Into a 300 ml reactor, were fed 70 g of propylene glycol monomethylether acetate (PGMEA) and 54 g of 20% by weight aqueous ammonia, and the reaction mixture was stirred at 30° C. for 20 minutes. Into the resultant solution, 26.3 g of tert-butyl 3-[3-(triethoxysilyl)propylthio] propionate synthesized in the step (2)(ii) in Example 3, 7.8 g of tetraethoxysilane and 6.7 g of triethoxymethylsilane were respectively added dropwise for 1 hour, and further stirred at 30° C. for 6 hours. Thereafter, the reaction solution was filtered by a membrane filter having mean hole size of 0.1 μm, and then ammonia was removed by rinsing the filtrate with purified water, and further water was removed by dehydration under a reduced pressure. After that, the content of propylene glycol monomethylether acetate (PGMEA) was adjusted to prepare a propylene glycol monomethylether acetate (PGMEA) solution of silicasol in which content of silicasol is 30% by weight.

(3) Preparation of a Photosensitive Resin Composition

The photosensitive resin obtained in the step (1) and the active component (silicasol) obtained in the step (2) were mixed together in the ratio specified in Table 3 (denoted by solid ratio without solvent) to prepare a photosensitive resin composition. Incidentally, the example without the active component (silicasol) was made as Comparative Example 3.

2. Pattern Formation and Evaluation of Properties (Sensitivity, Resolution and Oxygen Plasma Resistance)

(1) Pattern Formation

After treating a washed silicon wafer by hexamethyldisilazane, the photosensitive resin composition was coated on the wafer by means of a spin coater in order that a resist layer of 0.12 μm thick after dried was formed, and the wafer was baked on a hot plate at 130° C. for 1 minute. Thereafter, exposure was carried out using an exposing machine (manufactured by Litho Tech Japan Co. Ltd., VUVES-1200) having an exposing wavelength of 157 nm ($F_2$ excimer laser) with the exposure amount varied in steps. After baking the wafer at 130° C. on a hot plate for 1 minute, the wafer was paddle-developed with 2.38% by weight of a tetramethylammonium hydroxide aqueous solution for 1 minute to give a positive pattern.

(2) Evaluation of the Properties

The positive pattern was evaluated for its properties according to the following manner.

(i) Sensitivity: expressed in terms of the minimum amount of light exposure in which a resist was completely dissolved (the smaller the value is, the higher the sensitivity is).

(ii) Resolution: plotting logarithm of dissolving rate (nm/sec) relative to the amount of light exposure, finding slope angle θ of the liner part, making the γ value of tan θ as index of resolution (generally the larger the γ value is, the higher the resolution is).

(iii) Oxygen plasma resistance: evaluated in the same manner as Example 1.

The results are shown in Table 3.

TABLE 3

| | Composition | | | | |
|---|---|---|---|---|---|
| | Photosensitive resin (parts by weight) | Active component (silicasol) (parts by weight) | Sensitivity (mJ/cm$^2$) | Resolution (γ value) | O$_2$-RIE rate (nm/sec) |
| Ex. 5 | 1 | 0.11 | 5 | 3.8 | 93 |
| Ex. 6 | 1 | 0.25 | 4 | 5.3 | 48 |
| Ex. 7 | 1 | 0.43 | 3 | 4.3 | 32 |
| Ex. 8 | 1 | 1.00 | 1.5 | 3.0 | 20 |
| Comp. Ex. 3 | 1 | 0 | 8 | 1.2 | 150 |

Examples 9 to 12 and Comparative Example 4

1. Photosensitive Resin Composition (1) Preparation of a Photosensitive Resin

To 1 part by weight of polyvinylphenol resin having a weight average molecular weight of 8,000 in which 35 mol % of the hydroxyl group was substituted with t-BOC (tert-butoxycarbonyloxy) group, was added 0.02 part by weight of the photoactive acid generator represented by the following formula (A), and to the resultant mixture, 6 parts by weight of propylene glycol monomethyl ether acetate as a solvent were added and mixed to prepare a positive photoresist.

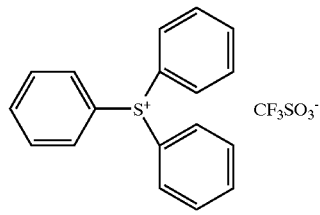

(A)

(2) Active Component (i) (ii) Synthesis of 1-(t-butoxycarbonyloxy)-4-iodobenzene and 1-[2-{(3-trimethoxysilyl)propyloxycarbonyl}vinyl]-4-(t-butoxycarbonyloxy)benzene In the same manner with the steps (i) and (ii) in Example 1, 1-(t-butoxycarbonyloxy)-4-iodobenzene and 1-[2-{(3-trimethoxysilyl)propyloxycarbonyl}vinyl]-4-(t-butoxycarbonyloxy)benzene were synthesized.

(iii) Modification of Silicasol 0.45 g of 1-[2-{(3-trimethoxysilyl)propyloxycarbonyl}vinyl]-4-(t-butoxycarbonyloxy)benzene obtained by the step (ii) was mixed with 15 g of colloidal silica (manufactured by Nissan Chemical Industries, Ltd., NPC-ST, silicasol content: 30%by weight) and 0.23 g of 0.05 mol/L hydrochloric acid, stirred at room temperature for 16 hours to modify silicasol. In this example, a weight ratio of 3-(trimethoxysilyl)propyl p-(t-butoxycarbonyloxy) cinnamate relative to silicasol is 1–10, and expressed it as a modified amount of 10% (modified silicasol A).

Moreover, in the modifying step of the silicasol, modified silicasols were prepared wherein the modified amount by 3-(trimethoxysilyl)propyl p-(t-butoxycarbonyloxy) cinnamate is 15% (modified silicasol B) and 30% (modified silicasol C), respectively, in the same operation with the above, except for the weight ratio of 1-[2-{(3-trimethoxysilyl)propyloxycarbonyl}vinyl]-4-(t-butoxycarbonyloxy)benzene/colloidal silica NPC-ST (solid basis)/hydrochloric acid (concentration of 0.05 mol/L) is 1.5/10/0.75 and 3/10/1.5.

(3) Preparation of a Photosensitive Resin Composition

The photosensitive resin obtained in the step (1) and the modified silicasol obtained in the step (2) were mixed together in the ratio specified in Table 4 (denoted by solid ratio without solvent) to prepare a photosensitive resin composition. Incidentally, the example without the modified silicasol was made as Comparative Example 4.

2. Pattern Formation and Evaluation of Properties (Sensitivity, Resolution and Oxygen Plasma Resistance)

(1) Pattern Formation

The photosensitive resin composition was coated on a washed silicon wafer by means of a spin coater in order that a resist layer of 0.40 μm thick after dried was formed, and the wafer was baked on a hot plate at 100° C. for 1 minute. Thereafter, exposure was carried out through a test mask having a line-and-space pattern with different line widths, using a reduced projection exposing machine (manufactured by Canon Inc., FPA-3000EX5, NA=0.63) having an exposing wavelength of 248 nm with the exposure amount varied in steps. After baking the wafer at 100° C. on a hot plate for 1 minute, the wafer was paddle-developed with 2.38% by weight of a tetramethylammonium hydroxide aqueous solution for 1 minute to give a positive pattern.

(2) Evaluation of the Properties

The positive pattern was evaluated for its properties according to the following manner.

(i) sensitivity: evaluated in the same manner as Example 1.
(ii) resolution: evaluated in the same manner as Example 1.
(iii) heat resistance: the wafers after development were separately placed on hot plates different in temperature for 5 minutes. The temperatures at which the patterns with 500 μm width began to deform were used as indexes of heat resistance.
(iv) Oxygen plasma resistance: evaluated in the same manner as Example 1.

The results are shown in Table 4.

TABLE 4

| | Composition | | | | | | |
|---|---|---|---|---|---|---|---|
| | Photosensitive resin (parts by weight) | Modified colloidal silica (parts by weight) | Modified amount of colloidal silica (%) | Sensitivity (mJ/cm²) | Resolution (μm) | Heat resistance (° C.) | O₂-RIE rate (nm/sec) |
| Ex. 9 | 1 | A 0.11 | 10 | 25 | 0.17 | 120 | 41 |
| Ex. 10 | 1 | A 0.25 | 10 | 20 | 0.18 | 130 | 11 |
| Ex. 11 | 1 | B 0.11 | 15 | 25 | 0.16 | 120 | 40 |
| Ex. 12 | 1 | C 0.11 | 30 | 28 | 0.15 | 120 | 42 |
| Comp. Ex. 4 | 1 | 0 | — | 50 | 0.23 | 100 | 70 |

Example 13 and Comparative Examples 5 to 6

1. Preparation of a Photosensitive Resin Composition (1) Preparation of a Photosensitive Resin Into a reactor, were fed 30 g of t-butyl methacrylate and 0.2 g of azobisisobutylonitrile, and dissolved to 200 mL of toluene. The reactor is substituted by argon, polymerization was conducted by heating solution at 60° C. with stirring for 12 hours. After completion of the polymerization, the reaction solution was poured into a large amount of methanol to solidify a resin. The solidified resin was rinsed with methanol several times. Thus obtained resin was dried at room temperature, under a reduced pressure for one night to prepare a poly tert-butyl methacrylate having a weight average molecular weight of 35000 (33% yield).

Into 1 part by weight of thus obtained poly tert-butyl methacrylate resin, was added 0.02 part by weight of the photoactive acid generator represented by the following formula (B), and mixed with 6 parts by weight of propylene glycol monomethyl ether acetate as a solvent to prepare a positive photoresist.

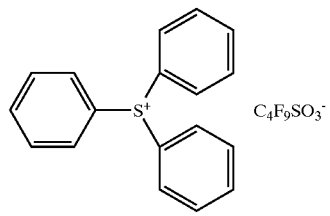

(2) Active Component (i) Synthesis of tert-butyl 3-[3-(triethoxysilyl)propiothio]Propionate tert-Butyl 3-[3-(triethoxysilyl)propiothio]propionate was synthesized in the same manner as the step (i) in Example 3.

(ii) Modification of Silicasol 0.45 g of tert-butyl 3-[3-(triethoxysilyl)propiothio] propionate synthesized by the step (i) was mixed with 15 g of colloidal silica (manufactured by Nissan Chemical Industries, Ltd., NPC-ST, silicasol content: 30% by weight) and 0.23 g of 0.05 mol/L hydrochloric acid, and stirred at room temperature for 16 hours to modify silicasol. In this example, the modified amount was 10% (modified silicasol D).

(3) Preparation of a Photosensitive Resin Composition

The photosensitive resin obtained in the step (1) and the modified silicasol D obtained in the step (2) were mixed together in the ratio specified in Table 5 (denoted by solid ratio without solvent) to prepare a photosensitive resin composition. Incidentally, the example using unmodified silicasol [manufactured by Nissan Chemical Industries, Ltd., colloidal silica NPC-ST, silicasol content: 30% by weight] instead of the modified silica D was made as Comparative Example 5, and the example without the silicasol was made as Comparative Example 6.

2. Pattern Formation and Evaluation of Properties (Sensitivity, Resolution, Heat Resistance and Oxygen Plasma Resistance)

(1) Pattern Formation

The photosensitive resin composition was coated on a washed silicon wafer by means of a spin coater in order that a resist layer of 0.30 μm thick after dried was formed, and the wafer was baked on a hot plate at 130° C. for 1 minute. Thereafter, exposure was carried out through a test mask having a line-and-space pattern with different line widths, using a reduced projection exposing machine (NA=0.60) having an exposing wavelength of 193 nm with the exposure amount varied in steps. After baking the wafer at 130° C. on a hot plate for 1 minute, the wafer was paddle-developed with 2.38% by weight of a tetramethylammonium hydroxide aqueous solution for 1 minute to give a positive pattern.

(2) Evaluation of the Properties

The positive pattern was evaluated for its properties according to the following manner.

(i) sensitivity, (ii) resolution and (iii) oxygen plasma resistance: evaluated in the same manner as Example 3. The results are shown in Table 5.

TABLE 5

|  | Composition | | | | | |
|---|---|---|---|---|---|---|
|  | Photosensitive resin (parts by weight) | Modified colloidal silica (parts by weight) | Modified amount of colloidal silica (%) | Sensitivity (mJ/cm$^2$) | Resolution (μm) | O$_2$-RIE rate (nm/sec) |
| Ex. 13 | 1 | modified silicasol D 0.11 | 10 | 7 | 0.14 | 68 |
| Comp. Ex. 5 | 1 | un-modified silicasol 0.11 | 0 | 7 | 0.18 | 72 |
| Comp. Ex. 6 | 1 | 0 | — | 14 | 0.18 | 150 |

Examples 14 to 16 and Comparative Examples 7 to 8

1. Preparation of a Photosensitive Resin Composition

The photosensitive resin (1) used in Example 9 or the photosensitive resin (2) used in Example 13, and a modified silicasol were mixed together in the ratio specified in Table 6 (denoted by solid ratio without solvent) to prepare a photosensitive resin composition.

Incidentally, regarding Example 15, in the modification step of silicasol in Example 9, a modified silicasol of 100% modification amount (modified silicasol E) was used, which was obtained by the same manner as Example 9 except that the weight ratio of 1-[2-{(3-trimethoxysilyl)propyloxycarbonyl}vinyl]-4-(t-butoxycarbonyloxy)benzene/colloidal silica NPC-ST (solid basis)/hydrochloric acid (concentration of 0.5 mol/L) was used as 10/10/5.

2. Pattern Formation and Evaluation of Properties (Sensitivity, Resolution, Heat Resistance and Oxygen Plasma Resistance)

(1) Pattern Formation

The photosensitive resin composition was coated on a washed wafer by means of a spin coater in order that a resist layer of 0.12 μm thick after dried was formed, and the wafer was baked on a hot plate at the temperature shown in Table 6 for 1 minute. Thereafter, exposure was carried out through a test mask having a line-and-space pattern with different line widths, using an exposing machine (manufactured by Litho Tech Japan Co. Ltd., VUVES-4500) having a $F_2$ excimer laser (exposing wavelength: 157 nm) as an exposure light source with the exposure amount varied in steps. After baking the wafer at the temperature shown in Table 6 on a hot plate for 1 minute, the wafer was paddle-developed with 2.38% by weight of a tetramethylammonium hydroxide aqueous solution for 1 minute to give a positive pattern.

(2) Evaluation of the Properties

Regarding the positive pattern, (i) sensitivity was expressed as the light exposure in which film thickness of the exposed area becomes 0, (the smaller the value is, the higher the sensitivity is), (ii) resolution was evaluated with the following process, making a sensitivity curve plotting of the thickness of a residual resist layer in the exposed area, relative to logarithm of an amount of light exposure, and finding a slope of the linear part (γ value) at the point of film thickness being 0 to treat it as index of resolution (the larger the value is, the higher the resolution is). Moreover, (iii) oxygen plasma resistance: evaluated in the same manner as Example 1.

The results are shown in Table 6.

collected by suction filtration, dried and recrystallized by methanol to prepare 22.6 g of 1-(t-butoxycarbonyloxy)-4-bromobenzene.

(ii) Synthesis of 1-(2-trimethoxysilylvinyl)-4-(t-butoxycarbonyloxy)benzene

Into a mixture of 20 ml of triethylamine and 40 ml of acetonitrile, were dissolved 15.0 g (54.9 mmol) of 1-(t-butoxycarbonyloxy)-4-bromobenzene synthesized in the step (i) and 9.76 g (65.9 mmol) of vinyltrimethoxysilane, and the reaction system was substituted by argon by bubbling argon in thus obtained solution. In the reaction system, was added 246.5 mg (1.1 mmol) of palladium acetate as a catalyst, the mixture was refluxed for one night. After completion of the reaction, solvent was removed, and the obtained residue was extracted by hexane. Hexane was removed from the extraction to prepare 9.5 g of 1-(2-trimethoxysilylvinyl)-4-(t-butoxycarbonyloxy)benzene being the objective compound.

The formula of the above-mentioned reaction steps is shown as follows:

TABLE 6

| | Composition | | | | | | |
|---|---|---|---|---|---|---|---|
| | Photosensitive resin (parts by weight) | Modified colloidal silica (parts by weight) | Modified amount of colloidal silica (%) | Pre baking (° C.) | Baking after exposure (° C.) | Sensitivity (mJ/cm$^2$) | γ value | O$_2$-RIE rate (nm/sec) |
| Ex. 14 | resin(1) 1 | A 0.11 | 10 | 100 | 100 | 16 | 3.7 | 39 |
| Ex. 15 | resin(1) 1 | E 0.11 | 100 | 100 | 100 | 12 | 4.5 | 37 |
| Comp. Ex. 7 | resin(1) 1 | 0 | — | 100 | 100 | 35 | 1.2 | 70 |
| Ex. 16 | resin(2) 1 | D 0.25 | 10 | 130 | 130 | 9 | 4.2 | 20 |
| Comp. Ex. 8 | resin(2) 1 | 0 | — | 130 | 130 | 15 | 1.5 | 150 |

Examples 17 to 20 and Comparative Examples 9 to 11

1. Preparation of a Photosensitive Resin Composition
(1) Photosensitive Resin

To 1 part by weight of polyvinylphenol resin having a weight average molecular weight of 8,500 in which 45 mol % of the hydroxyl group was substituted with ethoxyethyl group, was added 0.03 part by weight of the photoactive acid generator represented by the above-mentioned formula (A), and to the resultant mixture, 6 parts by weight of propylene glycol monomethyl ether acetate as a solvent were added and mixed to prepare a positive photoresist.

(2) Active Component
(i) Synthesis of 1-(t-butoxycarbonyoxy)-4-bromobenzene

Into 200 ml of acetone, in which 25.0 g (144.5 mmol) of p-bromophenol and 17.7 mg (0.14 mmol) of N,N-dimethylaminopyridine were dissolved, 31.5 g (144.5 mmol) of di-t-butylcarbonate was added dropwise at 40° C. After dropping, the reaction was kept with stirring for one night. After completion of the reaction, the reaction solution was put into 1 L of iced water. The formed precipitation was

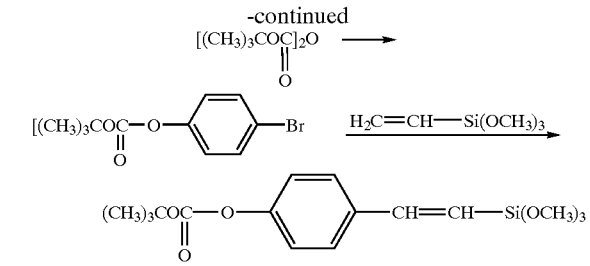

Figure 5:
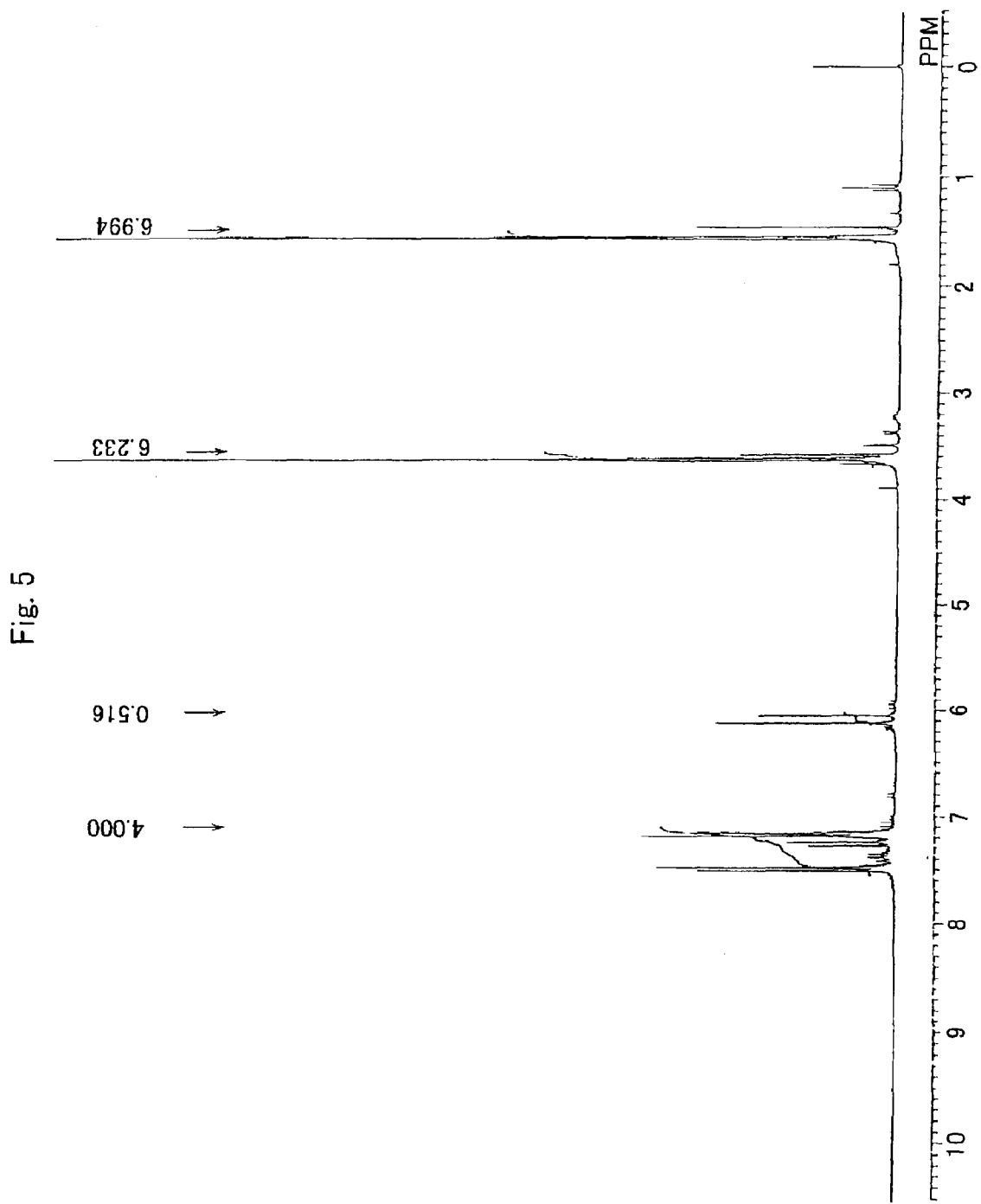
FIG. 5 shows $^1$H-NMR spectrum of a compound obtained in the step (2) (ii) in Example 17.

The $^1$H-NMR spectrum of the obtained compound is shown in FIG. 5.

$^1$H-NMR(CDCl$_3$) ppm: 1.6(s, 9H, t-Bu), 3.6(s, 9H, OCH$_3$), 6.1(d, 1H, C=CH), 7.2(d, 2H, C$_6$H$_4$), 7.3(d, 1H, C=CH), 7.5(d, 2H, C$_6$H$_4$)

(ii) Modification of Silicasol 1-(2-Trimethoxysilylvinyl)-4-(t-butoxycarbonyloxy)benzene obtained in the step (ii) was mixed with colloidal silica (manufactured by Nissan Chemical Industries, Ltd., NPC-ST, silicasol content: 30% by weight) and 0.05 mol/L hydrochloric acid, in a weight ratio of 1-(2-trimethoxysilylvinyl)-4-(t-butoxycarbonyloxy)benzene/colloidal silica NPC-ST (without solvent)/hydrochloric acid being 5/10/2.5 (modified amount of 50%) and 10/10/5 (modified amount of 100%), the mixture was stirred at room temperature for 16 hours to modify silicasol (the former is named as modified silicasol F, the latter, silicasol G).

(3) Preparation of a Photosensitive Resin Composition

The photosensitive resin obtained in the step (1) and the modified silicasol obtained in the step (2) were mixed together in the ratio shown in Table 7 (denoted by solid ratio without solvent) to prepare a photosensitive resin composition. Incidentally, the examples using the unmodified silicasol instead of the modified silicasol were made as Comparative Example 9 and 10, and the example without the silicasol was made as Comparative Example 11.

2. Pattern Formation and Evaluation of the Properties (Sensitivity, Resolution and Oxygen Plasma Resistance)

Conducted in the same way as Example 9.

for one night. After completion of the reaction, the reaction solution was put into 1 L of iced water. The formed precipitation was collected by suction filtration, dried, and recrystallized by methanol to prepare 22.8 g of 1-benzyloxy-4-t-butoxycarbonyoxybenzene.

(ii) Synthesis of 4-t-butoxycarbonyoxyphenol

Into 20.0 g (66.6 mmol) of 1-benzyloxy-4-t-butoxycarbonyoxybenzene synthesized in the step (i), were fed 150 ml of ethanol and 0.5 g of 10%-palladium carbon powder, and the mixture was reacted with 1492.2 ml (66.6 mmol) of hydrogen at room temperature with stirring. The reaction solution was filtrated to remove palladium carbon powder, and the filtrate was concentrated. After redissolving the concentrated filtrate to toluene, the solution was filtrated to remove insoluble. And then, the solution was kept still, and recrystallized to prepare 4-t-butoxycarbonyoxyphenol.

(iii) Reaction of 4-t-butoxycarbonyoxyphenol with Silane Coupling Agent

Into 8.4 g (40.0 mmol) of 4-t-butoxycarbonyoxyphenol synthesized in the step (ii), were fed 20 ml of n-hexane

TABLE 7

| | Composition | | | | |
| --- | --- | --- | --- | --- | --- |
| Photosensitive resin (parts by weight) | Modified colloidal silica (parts by weight) | Modified amount of colloidal silica (%) | Sensitivity (mJ/cm$^2$) | Resolution ($\mu$m) | O$_2$-RIE rate (nm/sec) |
| Ex. 17 | 1 | modified silicasol F 0.11 | 50 | 28 | 0.16 | 33 |
| Ex. 18 | 1 | modified silicasol F 0.25 | 50 | 20 | 0.15 | 8 |
| Ex. 19 | 1 | modified silicasol G 0.11 | 100 | 30 | 0.15 | 32 |
| Ex. 20 | 1 | modified silicasol G 0.25 | 100 | 19 | 0.14 | 8 |
| Comp. Ex. 9 | 1 | un-modified silicasol 0.11 | 0 | 28 | 0.21 | 35 |
| Comp. Ex. 10 | 1 | un-modified silicasol 0.25 | 0 | 21 | 0.23 | 10 |
| Comp. Ex. 11 | 1 | 0 | — | 40 | 0.21 | 75 |

Examples 21 to 23 and Comparative Example 12

1. Preparation of a Photosensitive Resin Composition
(1) Photosensitive Resin

To 1 part by weight of polyvinylphenol resin having a weight average molecular weight of 9,300 in which 40 mol % of the hydroxyl group was substituted with ethoxyethyl group, was added 0.02 part by weight of the photoactive acid generator represented by the above-mentioned formula (A), and to the resultant mixture, 6 parts by weight of propylene glycol monomethyl ether acetate as a solvent were added and mixed to prepare a positive photoresist.

(2) Active Component (i) Synthesis of 1-benzyloxy-4-t-butoxycarbonyoxybenzene

Into 200 ml of acetone, were dissolved 25.0 g (124.9 mmol) of 4-benzyloxyphenol and 15.3 mg (0.12 mmol) of N,N-dimethylaminopyridine, and 27.2 g (124.9 mmol) of di-t-butylcarbonate was added dropwise at 40° C. After completion of dropping, the reaction was kept with stirring dehydrated sufficiently, and 9.9 g (40.0 mmol) of 3-isocyanatopropyltriethoxysilane, and the mixture was allowed to react at room temperature for 16 hours with stirring.

The reaction solution was filtrated, and the filtrate was redissolved to 200 ml of a mixture of hexane and toluene in a weight ratio of 1/1, and then thus obtained solution was filtrated, and the resultant filtrate was recrystallized to give a product.

The formula of the above-mentioned reaction steps is shown as follows:

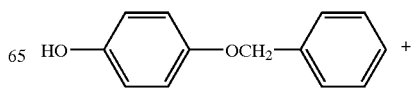

-continued

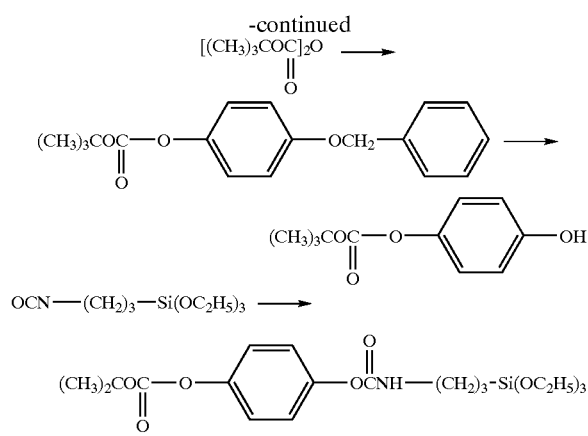

Figure 6:
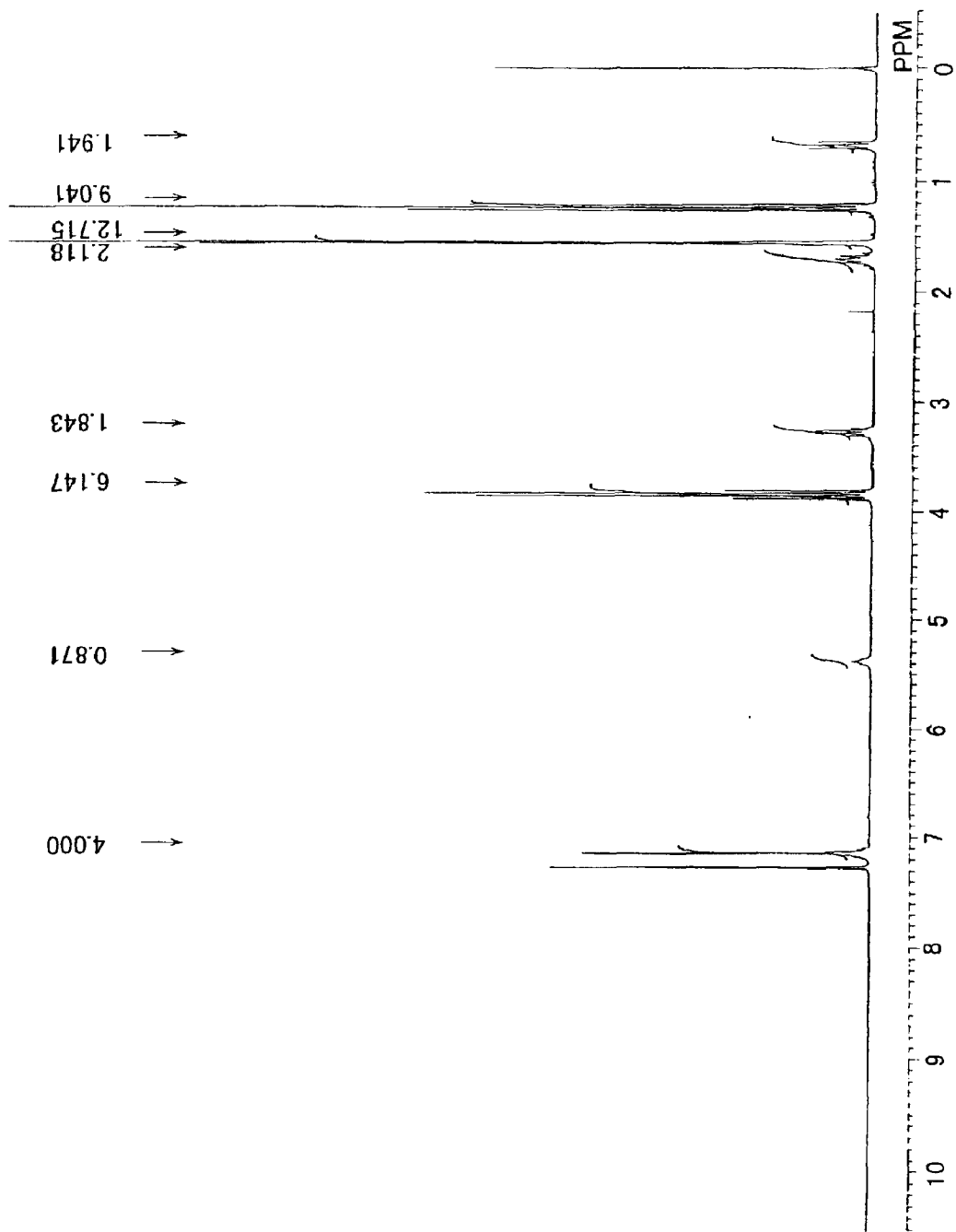
FIG. 6 shows $^1$H-NMR spectrum of a compound obtained in the step (2) (iii) in Example 21.

The $^1$H-NMR spectrum of the obtained product is shown in FIG. 6.

$^1$H-NMR(CDCl$_3$) ppm: 0.7(t, 2H, CH$_2$), 1.2(t, 9H, OCH$_2$CH$_3$), 1.6(s, 9H, t-Bu), 1.7(t, 2H, CH$_2$), 3.3(t, 2H, CH$_2$), 3.9(q, 6H, CH$_2$), 5.4(t, 1H, NH), 7.2(d, 4H, C$_6$H$_4$)

(iv) Modification of Silicasol

The compound synthesized in the step (iii) was mixed with colloidal silica (manufactured by Nissan Chemical Industries, Ltd., NPC-ST, silicasol content: 30% by weight) and 0.05 mol/L hydrochloric acid, in a weight ratio of the compound synthesized in the step (iii)/colloidal silica NPC-ST (without solvent)/hydrochloric acid being 5/10/2.5 (modified amount of 50%) and 10/10/5 (modified amount of 100%), the mixture was stirred at room temperature for 16 hours to modify silicasol (the former is mentioned as modified silicasol H, the latter is mentioned as modified silicasol I).

(3) Preparation of a Photosensitive Resin Composition

The photosensitive resin obtained in the step (1) and the modified silicasol obtained in the step (2) were mixed together in the ratio specified in Table 8 (denoted by solid ratio without solvent) to prepare a photosensitive resin composition. Incidentally, the example without the modified silicasol was made as Comparative Example 12.

2. Pattern Formation and Evaluation of the Properties (Sensitivity, Resolution and Oxygen Plasma Resistance)

Conducted in the same way as Example 9.

Example 24

(i) Synthesis of 1-(1-ethoxy)ethoxy-4-bromobenzene

Into 100 ml of dehydrated ethyl acetate, were fed 11.0 g (50 mmol) of p-bromophenol, and 4.8 ml of a solution composed of hydrochloric acid (1.0 mol/L) and ether, and the mixture was set at 40° C. Into the mixture, 10.8 g (150 mmol) of ethylvinylether was added dropwise, and the mixture was kept with stirring for one night. After completion of the reaction, the reaction solution was rinsed with sodium hydrogen carbonate solution and then rinsed with water to remove solvent. By purifying with silica gel column chromatography (eluate: hexane), 10.7 g (36.5 mmol) of 1-(1-ethoxy)ethoxy-4-bromobenzene was obtained.

NMR(CDCl$_3$) ppm: 1.2(t, 3H, terminal CH$_3$), 1.49 (t, 3H, branched CH$_3$), 3.47 to 3.6(m, 1H, OCH), 3.7 to 3.85(m, 1H, OCH), 5.34(q, 1H, branched OCH), 6.9(d, 2H, C$_6$H$_4$), 7.38(d, 2H, C$_6$H$_4$)

(ii) Synthesis of 4-[2-{(3-trimethoxysilyl)propyloxycarbony}vinyl]-1-{(1-ethoxy)ethoxy}benzene The objective compound was obtained in the same way with Hech reaction in the step (2) (ii) of Example 1, except for using 1-(1-ethoxy)ethoxy-4-bromobenzene synthesized in the step (i) instead of 1-(t-butoxycarbonyloxy)-4-iodobenzene in the step (2) (ii) in Example 1.

NMR(CDCl$_3$) ppm: 0.7(t, 2H, CH$_2$), 1.2(t, 3H, terminal CH$_3$), 1.49(t, 3H, branched CH$_3$), 1.8(t, 2H, CH$_2$), 3.55 to 3.65(m, 9H, OCH$_3$), 3.47 to 3.6(m, 1H, OCH), 3.7 to 3.85(m, 1H, OCH), 4.2(t, 2H, CH$_2$), 5.34(q, 1H, branched OCH), 6.4(d, 1H, C=CH), 7.6(d, 1H, C=CH), 6.9(d, 2H, C$_6$H$_4$), 7.38(d, 2H, C$_6$H$_4$)

Example 25

(i) Synthesis of 1-(1-ethoxy)ethoxy-4-bromobenzene

The objective compound was obtained in the same manner as the step (i) in Example 24.

(ii) Synthesis of 4-[2-(trimethoxysilyl)vinyl]-1-(1-ethoxy)ethoxybenzene

The objective compound was obtained in the same manner as Hech reaction in the step (2) (ii) of Example 1, except for using 1-(1-ethoxy)ethoxy-4-bromobenzene and trimethoxyvinylsilane instead of 1-(t-butoxycarbonyloxy)-4-iodobenzene and 3-trimethoxysilylpropylester of acrylic acid.

NMR(CDCl$_3$) ppm: 1.2(t, 3H, terminal CH$_3$), 1.49(t, 3H, branched CH$_3$), 3.47 to 3.6(m, 1H, OCH), 3.6(m, 9H, OCH$_3$), 3.7 to 3.85(m, 1H, OCH), 5.34(q, 1H, branched

TABLE 8

| | Composition | | | | |
|---|---|---|---|---|---|
| | Photosensitive resin (parts by weight) | Modified colloidal silica (parts by weight) | Modified amount of colloidal silica (%) | Sensitivity (mJ/cm$^2$) | Resolution ($\mu$m) | O$_2$-RIE rate (nm/sec) |
| Ex. 21 | 1 | modified silicasol H 0.43 | 50 | 12 | 0.14 | 2 |
| Ex. 22 | 1 | modified silicasol I 0.25 | 100 | 22 | 0.14 | 9 |
| Ex. 23 | 1 | modified silicasol I 0.43 | 100 | 11 | 0.13 | 3 |
| Comp. Ex. 12 | 1 | 0 | — | 32 | 0.22 | 80 |

OCH), 6.1(d, 1H, C=CH), 7.18(d, 2H, C$_6$H$_4$), 7.25(d, 1H, C=CH), 7.5(d, 2H, C$_6$H$_4$)

Example 26

(i) Synthesis of 1-benzyloxy-3-acetoxybenzene

Into 300 ml of dimethylsulfoxide, 30.4 g (200 mmol) of resorcylmonoacetate was dissolved, and aqueous solution of sodium hydrate (NaOH/H$_2$O: 8 g/30 ml) was added to this solution and stirred until the mixture being uniform. Then, 26.5 g (210 mmol) of benzyl chloride was added into the mixture, and allowed to react at room temperature for 24 hours. The reaction mixture was put into 1 L of iced water, and the obtained solid was collected by filtration, dried and recrystallized by ethanol to prepare 44.3 g (183 mmol) of 1-benzyloxy-3-acetoxybenzene.

(ii) Synthesis of 3-benzyloxyphenol

In 300 ml of 10% water-containing ethanol, 20 g (82 mmol) of 1-benzyloxy-3-acetoxybenzene obtained in the step (i) was hydrolyzed with 16.3 g (248 mmol) of potassium hydroxide, and neutralized to prepare 14.8 g (74 mmol) of 3-benzyloxyphenol.

(iii) Synthesis of 1-(1-ethoxy)ethoxy-3-benzyloxybenzene

The objective compound was obtained in the same way with the step (i) of Example 24, except for using 3-benzyloxyphenol instead of p-iodophenol.

(iv) Synthesis of 3-(1-ethoxy)ethoxyphenol

The objective compound was obtained in the same way with the step (2) (ii) of Example 21, except for using 1-(1-ethoxy)ethoxy-3-benzyloxybenzene obtained in the step (iii) instead of 1-benzyloxy-4-t-butoxycarbonyloxybenzene in the step (2) (ii) in Example 21.

(v) Synthesis of 1-(1-ethoxy)ethoxy-3-[(3-triethoxysilyl)propylaminocarbonyloxy]benzene The objective compound was obtained in the same way with the step (2) (iii) of Example 21, except for using 3-(1-ethoxy)ethoxyphenol obtained in the step (iv) instead of 4-t-butoxycarbonyloxyphenol.

The formula of the above-mentioned reaction steps is shown as follows:

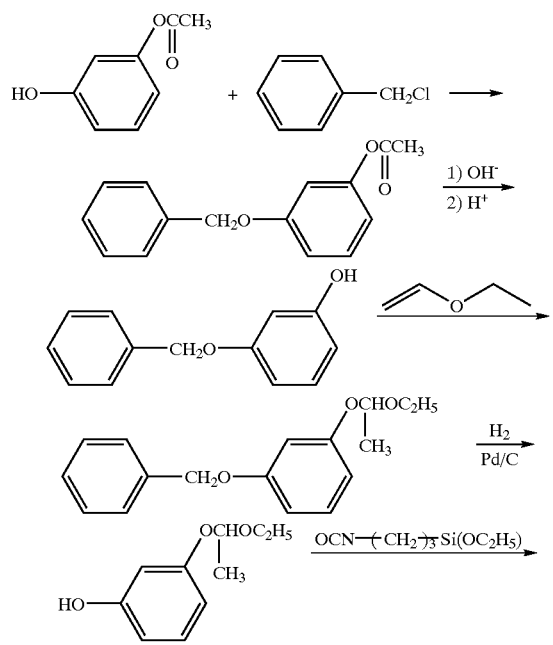

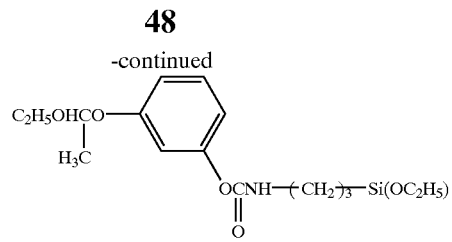

Example 27

(i) Synthesis of 1-benzyloxy-3-t-butoxycarbonyloxybenzene

The objective compound was obtained in the same way with the step (2) (i) of Example 21, except for using 3-benzyloxyphenol instead of 4-benzyloxyphenol in the step (2) (i) in Example 21.

(ii) Synthesis of 3-t-butoxycarbonyloxyphenol

The objective compound was obtained in the same way with the step (2) (ii) of Example 21, except for using 1-benzyloxy-3-t-butoxycarbonyloxybenzene obtained in the step (i) instead of 1-benzyloxy-4-t-butoxycarbonyloxybenzene in the step (2) (ii) in Example 21.

(iii) Reaction of 3-t-butoxycarbonyloxyphenol with Silane Coupling Agent

1-[3-(Triethoxysilyl)propylaminocarbonyloxy]-3-[t-butoxycarbonyloxy]benzene was obtained in the same way with the step (2) (iii) of Example 21, except for using 3-t-butoxycarbonyloxyphenol obtained in the step (ii) instead of 4-t-butoxycarbonyloxyphenol in the step (2) (iii) in Example 21.

The formula of the above-mentioned reaction steps is shown as follows:

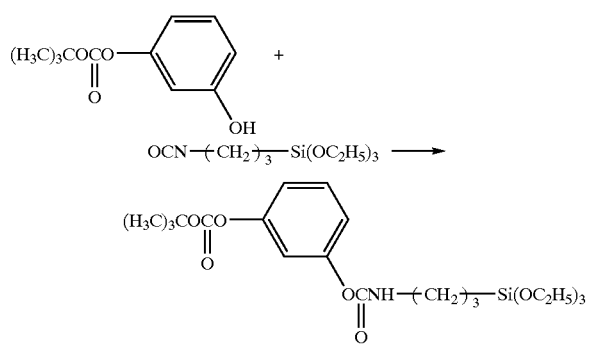

Example 28

Synthesis of 2-(triethoxysilyl)-1-(t-butoxycarbonyl)ethane

Into the 100 ml of dried tetrahydrofuran, were fed 25.8 g (20 mmol) of t-butyl acrylate and 32.8 g (20 mmol) of triethoxysilane, and the mixture was substituted by argon. To the mixture solution, 10 mg of chloroplatinic acid was added and the mixture was heated for 24 hours under reflux. After completion of the reaction, 58.5 g of the objective compound was obtained by removing solvent.

Example 29

Synthesis of N-[2-(t-butoxycarbonyl)ethyl]-3-(triethoxysilyl)propylamine

In dehydrated ethanol, 22.1 g (100 mmol) of 3-aminopropyltriethoxysilane was dissolved, and to the solution, was added 12.8 g (100 mmol) of t-butyl acrylate, and the mixture was stirred at room temperature for 24 hours. After completion of the reaction, 32.5 g of the objective compound was obtained by removing solvent.

NMR(CDCl$_3$) ppm: 0.6(t, 2H, CH$_2$), 1.19(t, 9H, CH$_3$), 1.41(s, 9H, t-Bu), 1.49 to 1.67(m, 2H, CH$_2$), 2.4(t, 2H, CH$_2$), 2.59(t, 2H, CH$_2$), 2.8(t, 2H, CH$_2$), 3.79(q, 6H, OCH$_2$)

The above-mentioned reaction formula is shown as follows:

$$H_2C=\overset{H}{C}-\overset{O}{\underset{\|}{C}}-OC(CH_3)_3 + H_2N(CH_2)_3Si(OC_2H_5)_3 \longrightarrow$$
$$(CH_3)_3CO\underset{\underset{O}{\|}}{C}(CH_2)_2NH(CH_2)_3Si(OC_2H_5)_3$$

Example 30

Synthesis of N,N'-di-(t-butoxycarbonyl)ethyl-3-(triethoxysilyl)propylamine

The objective compound was obtained in the same way with Example 29, except for using 25.6 g (200 mmol) of t-butylester of acrylic acid and heating for 24 hours under reflux.

NMR(CDCl$_3$) ppm: 0.5(t, 2H, CH$_2$), 1.19(t, 9H, CH$_3$), 1.39(s, 18H, t-Bu), 1.41 to 1.6(m, 2H, CH$_2$), 2.3(t, 6H, CH$_2$), 2.7(t, 4H, CH$_2$), 3.75(q, 6H, OCH$_2$)

The above-mentioned reaction formula is shown as follows:

$$H_2C=\overset{H}{C}-\overset{O}{\underset{\|}{C}}-OC(CH_3)_3 + 2\,H_2N(CH_2)_3Si(OC_2H_5)_3 \longrightarrow$$
$$(CH_3)_3CO\underset{\underset{O}{\|}}{C}(CH_2)_2N(CH_2)_3Si(OC_2H_5)_3$$
$$(CH_2)_2\underset{\underset{O}{\|}}{C}OC(CH_3)_3$$

Then, the properties of pattern were evaluated in the same manner as Example 2, except for using the compounds (active components) obtained in Examples 24 to 30 instead of the active component used in Example 2. The results of Examples 24 to 30 were same as the results of Example 2.

What is claimed is:

1. An active component for use in combination with a photosensitizer comprising a photosensitive resin composition, wherein the active component comprises at least one member selected from the group consisting of (a) an active metal alkoxide represented by the following formula (1):

$$(X)_{m-n}\text{-}M^m\text{-}[(U_1)_p\text{—}(U_2\text{-}Z)_t]_n \qquad (1)$$

wherein, X represents a hydrogen atom, a halogen atom, an alkoxy group or an alkoxycarbonyl group, M represents a metal atom whose valence m is not less than 2, U$_1$ represents a first connecting unit, U$_2$ represents a second connecting unit, Z represents a group causing a difference in solubility by light exposure, n represents an integer of not less than 1 with m>n, p represents 0 or 1, and t represents an integer of not less than 1, wherein the unit $(U_1)_p$—$(U_2\text{-}Z)_t$ in the formula (1) is represented by the following formula (3):

$$[(R^1)_q\text{—}(B)_r]_p\text{—}[\{(R^2)_u\text{—}(Ar)_v\}\text{-}Z]_t \qquad (3)$$

wherein

R$^1$ and R$^2$, is either the same or different, representing an alkylene group or an alkenylene group, B represents an ester bond, a thioester bond, an amide bond, a urea bond, a urethane bond, a thiourethane bond, an imino group, a sulfur atom or a nitrogen atom, Ar represents an arylene group or a cycloalkylene group, r and p are each 1; q, u, and v are each either 0 or 1; and q+r+u+v≧1, and t has the same meanings defined above;

or a polycondensate thereof, and (b) a particle represented by the following formula (2):

$$P\text{—}[(Y)_s\text{-}\{(U_1)_p\text{—}(U_2\text{-}Z)_t\}]_k \qquad (2)$$

wherein

P represents a fine particle carrier,

Y represents a coupling residue, k represents an integer of not less than 1, s represents 0 or 1, and U$_1$, U$_2$, Z, p and t have the same meanings defined above.

2. An active component according to claim 1, which is in the form of a particle, or an oligomer.

3. An active component according to claim 1, wherein the group Z is (a) a photo-crosslinkable group or a photo-curable group, or (b) a hydrophilic group protected by a protective group which is capable of being removed by light exposure.

4. An active component according to claim 1, wherein the group Z is a hydrophilic group protected by a protective group which is capable of being removed by light exposure in association with a photosensitizer.

5. An active component according to claim 3, wherein the protective group is capable of being removed by an acid.

6. An active component according to claim 1, wherein the group Z is capable of forming a hydroxyl group or a carboxyl group by removal of a hydrophobic protective group.

7. An active component according to claim 3, wherein the protective group is (i) a protective group for a hydroxyl group, selected from the group consisting of an alkoxyalkyl group, an acyl group, an alkoxycarbonyl group, an oxacycloalkyl group and a crosslinked cyclic alicyclic group; or (ii) a protective group for a carboxyl group, selected from the group consisting of an alkyl group, a carbamoyl group and a crosslinked cyclic or alicyclic group.

8. An active component according to claim 3, wherein the protective group is (1) a protective group for a hydroxyl group, selected from the consisting of a C$_{1-6}$alkyl-carbonyl group, a C$_{1-6}$alkoxy-C$_{1-6}$alkyl group, a C$_{1-6}$alkoxy-carbonyl group and an oxacycloalkyl group; or (2) a protective group for a carboxyl group, selected from the group consisting of a C$_{1-6}$alkyl group, a carbamoyl group, a C$_{1-6}$alkyl-carbamoyl group, a C$_{6-10}$aryl-carbamoyl group and a bi- or tricycloalkyl group.

9. An active component according to claim 1, wherein the metal atom M is one member selected from the group consisting of aluminium, titanium, zirconium and silicon.

10. An active component according to claim 1, wherein the metal atom M is silicon.

11. An active component according to claim 1, wherein each of the connecting units, $U_1$ and $U_2$, is a unit containing at least one member selected from the group consisting of a chain hydrocarbon, a hydrocarbon ring, a chain hydrocarbon having a hetero atom, and a heterocycle.

12. An active component according to claim 1, wherein, in the formula (1), the group Z represents a hydroxyl or carboxyl group protected by a hydrophobic protective group which is capable of being removed by light exposure, and the metal atom M is selected from the group consisting of aluminium, titanium, zirconium and silicon.

13. An active component according to claim 1, wherein the active metal alkoxide component is the polycondensate of the active metal alkoxide and the active component further comprises a metal alkoxide represented by the following formula (5):

$$(X)_{m-n-1}(R^5)_{n-1} \tag{5}$$

wherein, $R^5$ represents a hydrogen atom or an alkyl group, and X, M, m and n have the same meanings defined above.

14. An active component according to claim 13, wherein the weight ratio of the polycondensate of the active metal alkoxide to the metal alkoxide ranges from 10/90 to 90/10.

15. An active component according to claim 1, wherein the polycondensate is in the form of a particle having a mean particle size of 1 to 100 nm.

16. An active component according to claim 1, wherein the mean particle size of the fine particle carrier ranges from 1 to 100 nm.

17. An active component according to claim 1, wherein the fine particle carrier comprises an inorganic fine particle carrier.

18. An active component according to claim 1, wherein the fine particle carrier comprises a silicasol.

19. An active component comprising a particle, wherein the particle comprises
a connecting unit U connecting with an inorganic fine particle P whose mean particle size is 1 to 50 nm through a silane coupling agent Y, a hydrophilic group connecting with the connecting unit, and a protective group which protects the hydrophilic group, wherein the hydrophilic group and the protective group constitute a group Z which causes a difference in solubility by light exposure;
the connecting unit comprises at least one member selected from the group consisting an aromatic $C_{6-12}$hydrocarbon ring, a monocyclic alicyclic hydrocarbon ring, a crosslinked cyclic alicyclic hydrocarbon ring and an aliphatic hydrocarbon chain;
the hydrophilic group is a hydroxyl group or a carboxyl group; and
the protective group is (1) a protective group for the hydroxyl group, selected from the group consisting of a $C_{1-4}$ alkyl-carbonyl group, a $C_{1-4}$alkoxy-$C_{1-4}$alkyl group, a $C_{1-4}$alkoxy-carbonyl group and a 5- or 6-membered oxacycloalkyl group, or (2) a protective group for the carboxyl group, selected from the group consisting of a $C_{1-4}$alkyl group, a carbamoyl group, a $C_{1-4}$alkyl-carbamoyl group, a $C_{6-10}$aryl-carbamoyl group and a bi- or tricycloalkyl group.

20. An active component according to claim 19, wherein the amount of the silane coupling agent is 0.1 to 200 parts by weight relative to 100 parts by weight of the fine particle carrier.

21. A photosensitive resin composition which comprises a base resin, a photosensitizer and the active component according to claim 1.

22. A photosensitive resin composition according to claim 21, wherein the resin composition is a positive and contains an exposed area that is water- or alkali-soluble.

23. A photosensitive resin composition according to claim 21, wherein the base resin comprises a homo- or copolymer of a monomer which is capable of forming a hydrophilic group by reacting with an acid, and the photosensitizer comprises an photoactive acid generator.

24. A process for forming a pattern, which comprises the steps of:
applying or coating the photosensitive resin composition according to claim 21 onto a substrate,
exposing the coating layer to light,
heat-treating the light-exposed layer, and
developing the heat-treated layer to form a pattern.

25. An active metal alkoxide which is represented by the following formula (1):

$$(X)_{m-n}\text{-}M^m\text{-}\{(U_1)_p\text{—}(U_2\text{-}Z)_t\}_n \tag{1}$$

wherein

X represents a hydrogen atom, a halogen atom, an alkoxy group or an alkoxycarbonyl group, M represents a metal atom whose valence m is not less than 2, $U_1$ represents a first connecting unit, $U_2$ represents a second connecting unit, Z represents a group causing a difference in solubility by light exposure, n represents an integer of not less than 1 with m>n, p represents 0 or 1, and t represents 1 or 2 wherein the unit $(U_1)_p$—$(U_2$-$Z)_t$ in the formula (1) is represented by the following formula (3):

$$[(R^1)_q\text{—}(B)_r]_p\text{—}[\{(R^2)_u\text{—}(Ar)_v\}\text{-}Z]_t \tag{3}$$

wherein $R^1$ and $R^2$, is either the same or different, representing an alkylene group or a alkenylene group, B represents an ester bond, a thioester bond, an amide bond, a urea bond, a urethane bond, a thiourethane bond, an imino group, a sulfur atom or a nitrogen atom, Ar represents an arylene group or a cycloalkylene group, r and p are each 1, q, u, and v are each either 0 or 1; and q+r+u+v≧1, and t has the same meaning defined above.

26. An oligomer or an active particle, which comprises at least a polycondensate of an active metal alkoxide recited in claim 25.

* * * * *